(12) United States Patent
Ahn et al.

(10) Patent No.: US 11,158,683 B2
(45) Date of Patent: Oct. 26, 2021

(54) DISPLAY DEVICE HAVING AN ALIGNMENT STRUCTURE

(71) Applicant: Samsung Display Co., Ltd., Yongin-Si (KR)

(72) Inventors: Jeaheon Ahn, Hwaseong-si (KR); Jeongki Kim, Hwaseong-si (KR); Yeo Geon Yoon, Suwon-si (KR); Seok-Joon Hong, Seongnam-si (KR)

(73) Assignee: Samsung Display Co., Ltd.

(*) Notice: Subject to any disclaimer, the term of this patent is extended or adjusted under 35 U.S.C. 154(b) by 0 days.

(21) Appl. No.: 16/816,341

(22) Filed: Mar. 12, 2020

(65) Prior Publication Data

US 2020/0321401 A1    Oct. 8, 2020

(30) Foreign Application Priority Data

Apr. 2, 2019 (KR) .......... 10-2019-0038520

(51) Int. Cl.
*H01L 27/32* (2006.01)
*H01L 23/544* (2006.01)
(Continued)

(52) U.S. Cl.
CPC .......... *H01L 27/322* (2013.01); *H01L 23/544* (2013.01); *H01L 27/3272* (2013.01);
(Continued)

(58) Field of Classification Search
CPC . H01L 27/322; H01L 27/3272; H01L 23/544; H01L 51/5256; H01L 51/525; H01L 51/5253; H01L 51/5268; H01L 27/3211; H01L 27/3216; H01L 27/3218; H01L 29/78633; H01L 2223/54426;
(Continued)

(56) References Cited

U.S. PATENT DOCUMENTS 7,612,860 B2 * 11/2009 Kim .................. G02F 1/133514
349/158
8,049,222 B2 * 11/2011 Sohn ..................... G02F 1/1333
257/72

(Continued)

FOREIGN PATENT DOCUMENTS

EP         1553807 A1    7/2005
KR    10-2006-0025101 A    3/2006

OTHER PUBLICATIONS

Extended European Search Report, Application No. 20166656.7 dated Oct. 5, 2020, 10 pages.

*Primary Examiner* — Ida M Soward
(74) *Attorney, Agent, or Firm* — Innovation Counsel LLP

(57) ABSTRACT

A display device includes a lower substrate, a sub-pixel structure, an optical filter layer, a color filter layer, an upper substrate, and an alignment structure. The lower substrate has a display area and a peripheral area surrounding the display area. The sub-pixel structure is disposed in the display area on the lower substrate. The optical filter layer is disposed on the sub-pixel structure. The color filter layer is disposed on the optical filter layer. The upper substrate is disposed on the color filter layer. The alignment structure is disposed in the peripheral area on a bottom surface of the upper substrate, and contains a material equal to a material forming the optical filter layer and the color filter layer.

20 Claims, 29 Drawing Sheets

(51) Int. Cl.
*H01L 51/52* (2006.01)
*H01L 29/78* (2006.01)
*G02F 1/13* (2006.01)
*H01L 51/56* (2006.01)
*G02F 1/1362* (2006.01)
*G02F 1/1335* (2006.01)
*H01L 29/786* (2006.01)

(52) U.S. Cl.
CPC ........ *H01L 51/525* (2013.01); *H01L 51/5246* (2013.01); *H01L 51/5253* (2013.01); *H01L 51/5268* (2013.01); *H01L 51/56* (2013.01); *G02F 1/133509* (2013.01); *G02F 1/133512* (2013.01); *G02F 1/133514* (2013.01); *G02F 1/136209* (2013.01); *H01L 27/3211* (2013.01); *H01L 27/3216* (2013.01); *H01L 27/3218* (2013.01); *H01L 29/78633* (2013.01); *H01L 2223/54426* (2013.01); *H01L 2224/0213* (2013.01); *H01L 2227/323* (2013.01); *H01L 2251/5369* (2013.01)

(58) Field of Classification Search
CPC ....... H01L 2224/0213; G02F 1/133514; G02F 1/136209; G02F 1/133509; G02F 1/133512; G02F 2001/136222; G02F 2001/133354

See application file for complete search history.

(56) References Cited

U.S. PATENT DOCUMENTS

| | | | | |
|---|---|---|---|---|
| 8,310,609 | B2* | 11/2012 | Yoshida | G02F 1/134363 |
| | | | | 349/40 |
| 8,884,849 | B2* | 11/2014 | Masuda | H01L 27/3272 |
| | | | | 345/76 |
| 9,389,465 | B2* | 7/2016 | Sonoda | G02F 1/133345 |
| 9,680,054 | B2 | 6/2017 | Coe-Sullivan et al. | |
| 9,798,183 | B2* | 10/2017 | Kimura | G02F 1/1336 |
| 9,841,629 | B2* | 12/2017 | Chen | G02F 1/13392 |
| 10,254,591 | B2* | 4/2019 | Yun | G02F 1/1368 |
| 2007/0284763 | A1* | 12/2007 | Kim | H05K 3/361 |
| | | | | 257/797 |
| 2017/0076678 | A1 | 3/2017 | Lee et al. | |
| 2018/0040681 | A1* | 2/2018 | Sakairi | H01L 51/56 |
| 2019/0155094 | A1* | 5/2019 | Kim | G02F 1/1339 |
| 2020/0035762 | A1* | 1/2020 | Kim | H01L 27/3262 |
| 2021/0151532 | A1* | 5/2021 | Kim | H01L 27/3246 |

* cited by examiner

DISPLAY DEVICE HAVING AN ALIGNMENT STRUCTURE

CROSS-REFERENCE TO RELATED APPLICATION

This application claims priority under 35 USC § 119 to Korean Patent Application No. 10-2019-0038520 filed on Apr. 2, 2019 in the Korean Intellectual Property Office (KIPO), the entire disclosure of which is incorporated herein by reference.

BACKGROUND

1. Field

Example embodiments relate generally to a display device. More particularly, embodiments of the present inventive concept relate to a display device including an optical filter layer and a color filter layer.

2. Description of the Related Art

A flat panel display device is used as a display device to replace a cathode ray tube display device because the flat panel display device has light weight and reduced thickness or the like. A liquid crystal display device and an organic light emitting diode display device are used as representative examples of the flat panel display device.

Recently, a display device including a quantum dot layer and a color filter has been developed. The display device may include a lower substrate and an upper substrate. In the manufacturing process of the display device, semiconductor elements, light emitting structures or the like may be provided on a top surface of the lower substrate, and the quantum dot layer and the color filter may be provided on a bottom surface of the upper substrate. Then, after the top surface of the lower substrate is positioned to face the bottom surface of the upper substrate, the lower substrate and the upper substrate may be coupled to each other by a sealant so as to manufacture the display device. However, in the process of forming the quantum dot layer and the color filter on the bottom surface of the upper substrate, the quantum dot layer and the color filter are not formed at accurate positions, and a misalignment occurs, thus a defect may be generated in the display device.

SUMMARY

Some example embodiments provide a display device including an optical filter layer and a color filter layer.

According to some example embodiments, a display device includes a lower substrate, a sub-pixel structure, an optical filter layer in the display area, a color filter layer in the display area, an upper substrate, and an alignment structure. The lower substrate has a display area and a peripheral area surrounding the display area. The sub-pixel structure is disposed in the display area on the lower substrate. The optical filter layer is disposed on the sub-pixel structure. The color filter layer is disposed on the optical filter layer. The upper substrate is disposed on the color filter layer. The alignment structure is disposed in the peripheral area on a bottom surface of the upper substrate, and contains a material equal to a material forming the optical filter layer and the color filter layer.

In example embodiments, the alignment structure may have at least two layers partially overlapping each other.

In example embodiments, the display device may further include a light shielding pattern disposed between the upper substrate and the optical filter layer in the display area and the peripheral area on the bottom surface of the upper substrate.

In example embodiments, the light shielding pattern may have a first opening in the peripheral area. The first opening may expose the alignment structure.

In example embodiments, the color filter layer may include first to third color filter patterns, and the alignment structure may include first to third color filter alignment patterns disposed in the first opening. Each of the first to third color filter patterns may have a width equal to a width of each of the first to third color filter alignment patterns.

In example embodiments, adjacent two color filter alignment patterns among the color filter alignment patterns may partially overlap each other.

In example embodiments, the light shielding pattern may further include a second opening in the peripheral area. The optical filter layer may include first to third optical filter patterns, and the alignment structure may further include first to third optical filter alignment patterns disposed in the second opening. Each of the first to third optical filter patterns may have a width equal to a width of each of the first to third optical filter alignment patterns.

In example embodiments, the optical filter alignment patterns may be spaced apart from each other.

In example embodiments, the alignment structure may further include reference alignment patterns disposed between the color filter alignment patterns and the upper substrate and between the optical filter alignment patterns and the upper substrate, and the reference alignment patterns may be disposed on a same layer as the light shielding pattern. Each of the color filter alignment patterns and the optical filter alignment patterns may partially overlap the reference alignment patterns.

In example embodiments, the alignment structure may include a first color filter alignment pattern, a second color filter alignment pattern disposed in the first opening and, a third color filter alignment pattern disposed in the first opening and, and first reference alignment patterns. The first color filter alignment pattern may be disposed in the first opening on the bottom surface of the upper substrate. The second color filter alignment pattern may partially overlap one side of the first color filter alignment pattern on the bottom surface of the upper substrate. The third color filter alignment pattern may partially overlap one side of the second color filter alignment pattern on the bottom surface of the upper substrate. The first reference alignment patterns may be disposed in the first opening and spaced apart from each other between the first, second and third color filter alignment patterns and the upper substrate.

In example embodiments, the alignment structure may further include a first optical filter pattern, a second optical filter pattern disposed in the second opening, a third optical filter pattern disposed in the second opening, and second reference alignment patterns disposed in the second opening. The first optical filter pattern may be disposed in the second opening on the bottom surface of the upper substrate. The second optical filter pattern may be spaced apart from the first optical filter alignment pattern on the bottom surface of the upper substrate in a first direction. The third optical filter pattern may be spaced apart from the second optical filter alignment pattern on the bottom surface of the upper substrate in the first direction. The second reference alignment patterns may be spaced apart from each other between the first, second and third optical filter alignment patterns and the upper substrate.

In example embodiments, the alignment structure may further include a fourth color filter alignment pattern disposed in the first opening and a fourth optical filter pattern disposed in the second opening. The fourth color filter alignment pattern may partially overlap one side of the third color filter alignment pattern on the bottom surface of the upper substrate. The fourth optical filter pattern may be spaced apart from the third optical filter alignment pattern on the bottom surface of the upper substrate in the first direction. The overlapping portion between the first and second color filter alignment patterns may be defined as a first overlapping portion. The overlapping portion between the second and third color filter alignment patterns may be defined as a second overlapping portion. The overlapping portion between the third and fourth color filter alignment patterns may be defined as a third overlapping portion. The spaced portion between the first and second optical filter alignment patterns may be defined as a first spaced portion. The spaced portion between the second and third optical filter alignment patterns may be defined as a second spaced portion. The spaced portion between the third and fourth optical filter alignment patterns may be defined as a third spaced portion.

In example embodiments, the color filter layer may be disposed in the third opening, and the third opening may overlap the sub-pixel structure and the optical filter layer.

In example embodiments, the display device may further include a sealing pattern spaced apart from the sub-pixel structure, the optical filter layer, and the color filter layer in the peripheral area between the lower substrate and the upper substrate, and the sealing pattern may surround the display area.

In example embodiments, the light shielding pattern may include a plurality of protrusions at an outer periphery of the light shielding pattern, and the alignment structure may overlap with the protrusions of the light shielding pattern.

In example embodiments, the display device may further include a light shielding pattern and a sealing pattern. The light shielding pattern may be disposed between the upper substrate and the optical filter layer in the display area. The sealing pattern may be spaced apart from the light shielding pattern in the peripheral area between the lower substrate and the upper substrate, and may surround the light shielding pattern. The alignment structure may be disposed on opposite side of the display area with respect to the sealing pattern and spaced apart from the sealing pattern in an outward direction.

In example embodiments, the sub-pixel structure may include first, second, and third sub-pixel structures, and each of the first to third sub-pixel structures may include a lower electrode, a light emitting layer, and an upper electrode. The lower electrode may be disposed on the lower substrate. The light emitting layer may be disposed on the lower electrode. The upper electrode may be disposed on the light emitting layer. The light emitting layer may emit blue light, and is integrally formed in the display area on the lower substrate.

In example embodiments, the optical filter layer may include a first quantum dot pattern, a scattering pattern, and a second quantum dot pattern. The first quantum dot pattern may be disposed on the first sub-pixel structure to convert blue light into green light. The scattering pattern may be disposed on the second sub-pixel structure to transmit the blue light. The second quantum dot pattern may be disposed on the third sub-pixel structure to convert the blue light into red light.

In example embodiments, the color filter layer may include a first color filter pattern, a second color filter pattern, and a third color filter pattern. The first color filter pattern may be disposed on the first quantum dot pattern to transmit green light. The second color filter pattern may be disposed on the scattering pattern to transmit blue light. The third color filter pattern may be disposed on the second quantum dot pattern to transmit red light.

In example embodiments, the display device may further include a thin film encapsulation structure disposed in the display area between the sub-pixel structure and the optical filter layer.

As the display device according to the exemplary embodiments of the present inventive concept includes the alignment structure disposed on the bottom surface of the upper substrate, so that it can be confirmed whether the color filter layer and the optical filter layer are accurately formed in the display area on the bottom surface of the upper substrate. Accordingly, the defective rate of the display device can be reduced.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Figure 1:
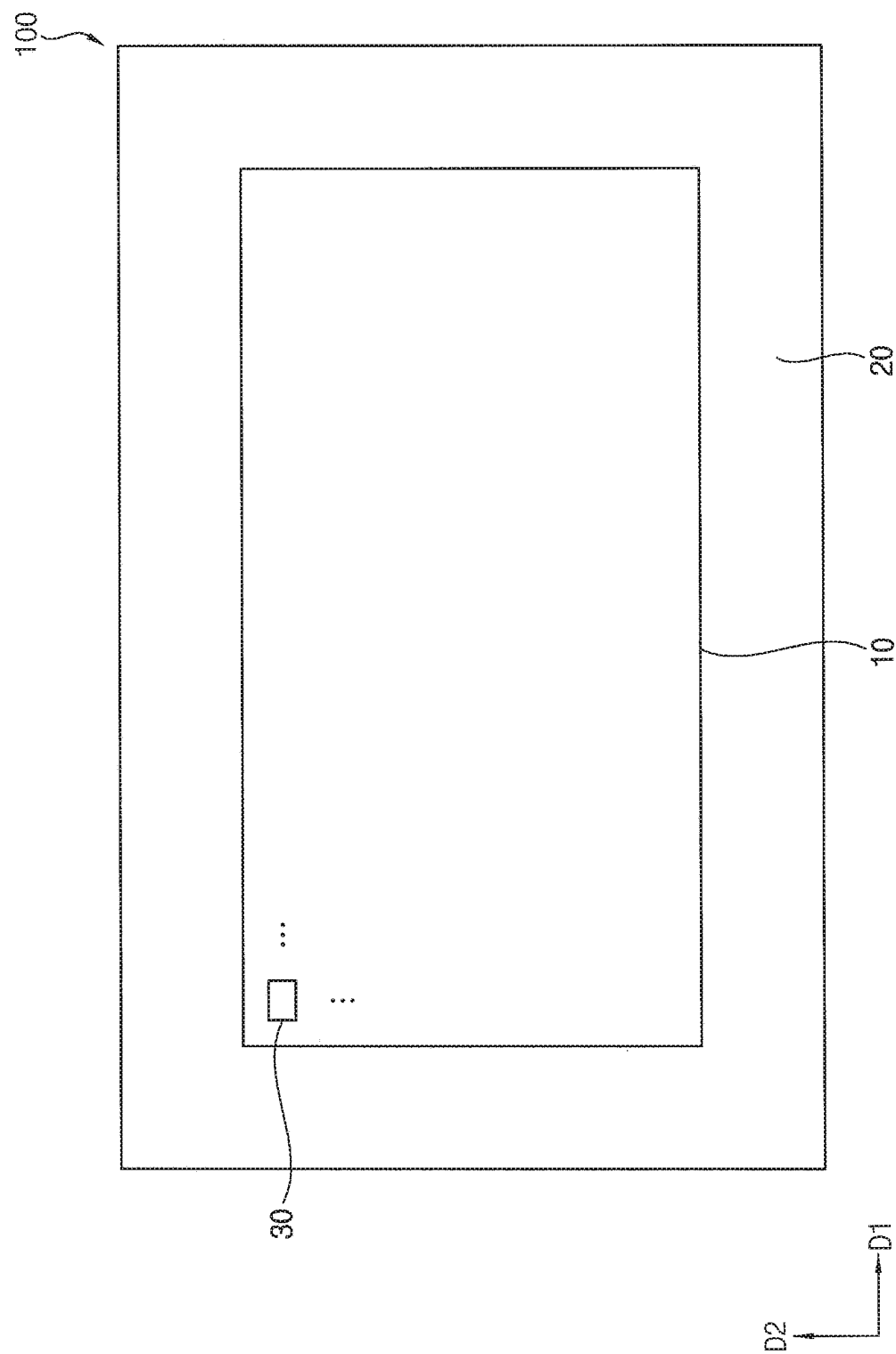
FIG. 1 is a plan view showing a display device according to exemplary embodiments of the present inventive concept.

Hereinafter, display devices and a method of manufacturing a display device according to exemplary embodiments of the present inventive concept will be described in detail with reference to the accompanying drawings. In the accompanying drawings, same or similar reference numerals refer to the same or similar elements.

Figure 2:
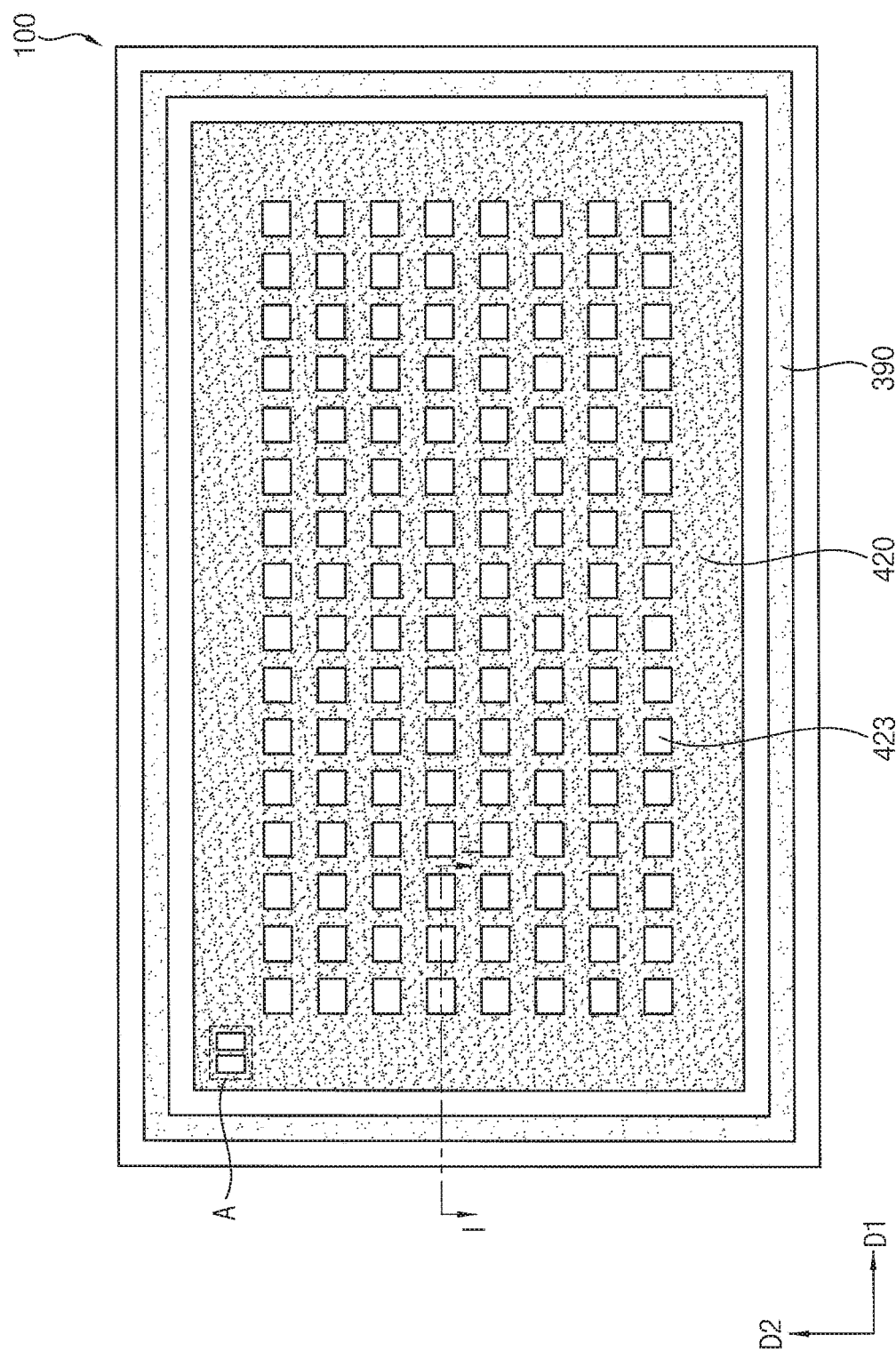
FIG. 2 is a plan view explaining a light shielding pattern included in the display device of FIG. 1.
Figure 3:
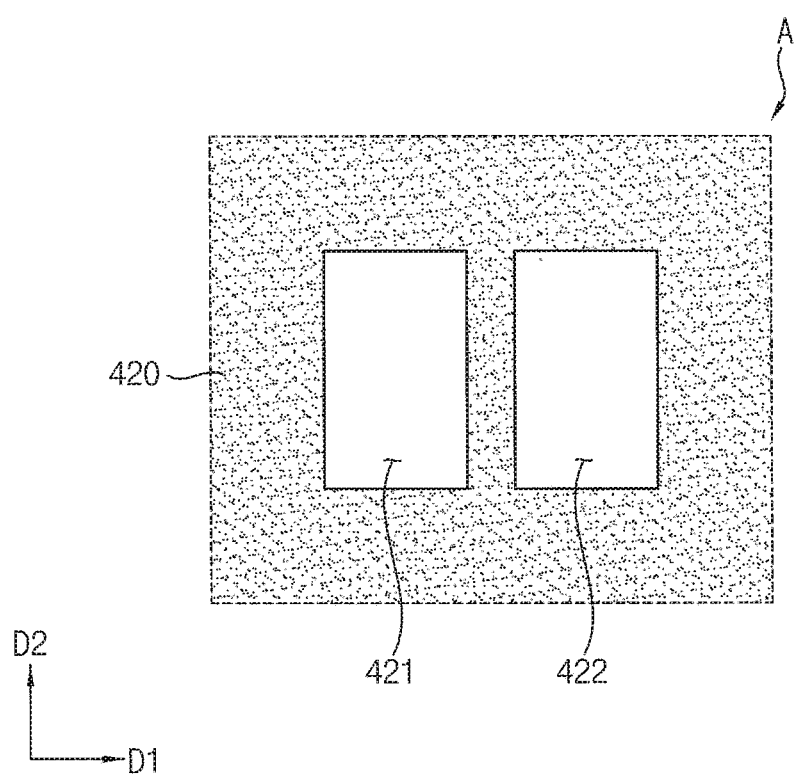
FIG. 3 is a partially enlarged plan view enlarging and showing the "A" area of FIG. 2.
Figure 4:
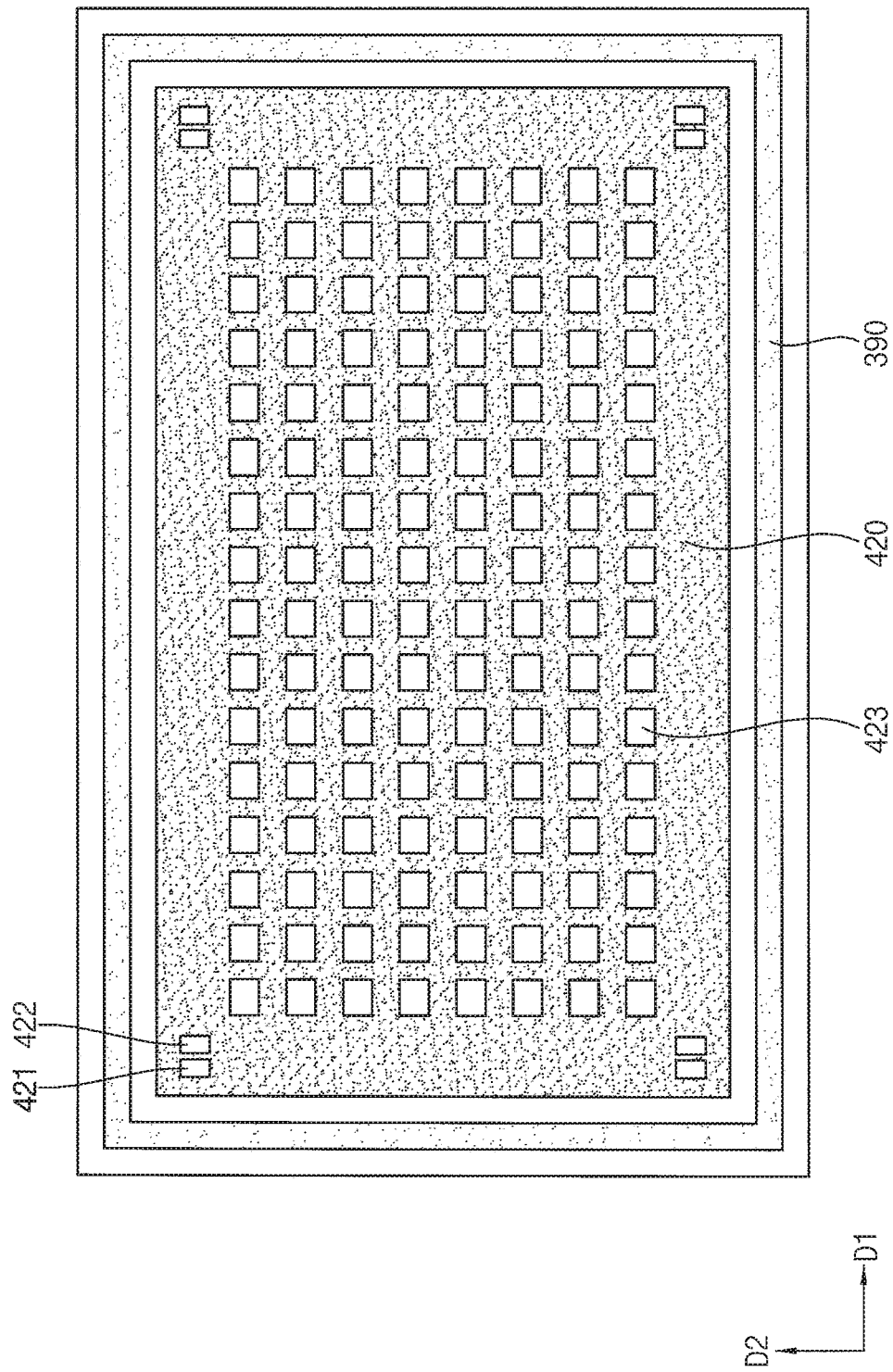
FIG. 4 is a plan view showing an example of the light shielding pattern of FIG. 2.
Figure 5:
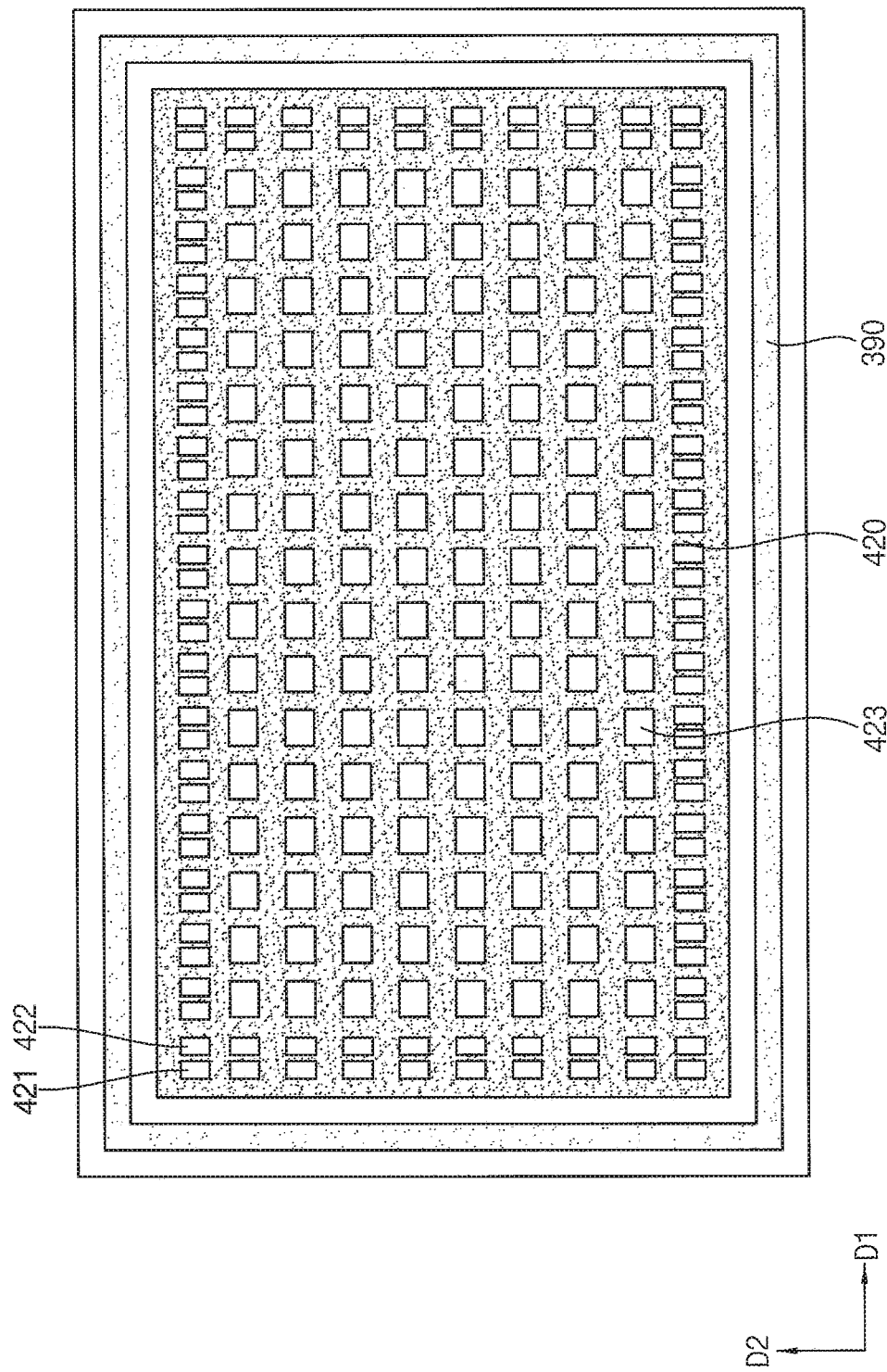
FIG. 5 is a plan view showing another example of the light shielding pattern of FIG. 2.

FIG. 1 is a plan view showing a display device according to exemplary embodiments of the present inventive concept. FIG. 2 is a plan view explaining a light shielding pattern included in the display device of FIG. 1. FIG. 3 is a partially enlarged plan view enlarging and showing the "A" area of FIG. 2. FIG. 4 is a plan view showing an example of the light shielding pattern of FIG. 2. FIG. 5 is a plan view showing another example of the light shielding pattern of FIG. 2.

Referring to FIGS. 1, 2 and 3, the display device 100 may include a lower substrate, a light shielding pattern 420, an alignment structure, a sealing pattern 390, an upper substrate, and the like.

As shown in FIG. 1, the display device 100 may include a display area 10 and a peripheral area 20 surrounding the display area 10. The display area 10 may include a plurality of sub-pixel areas 30. The sub-pixel areas 30 may be entirely arranged to have a matrix form in the display area 10.

Figure 7:
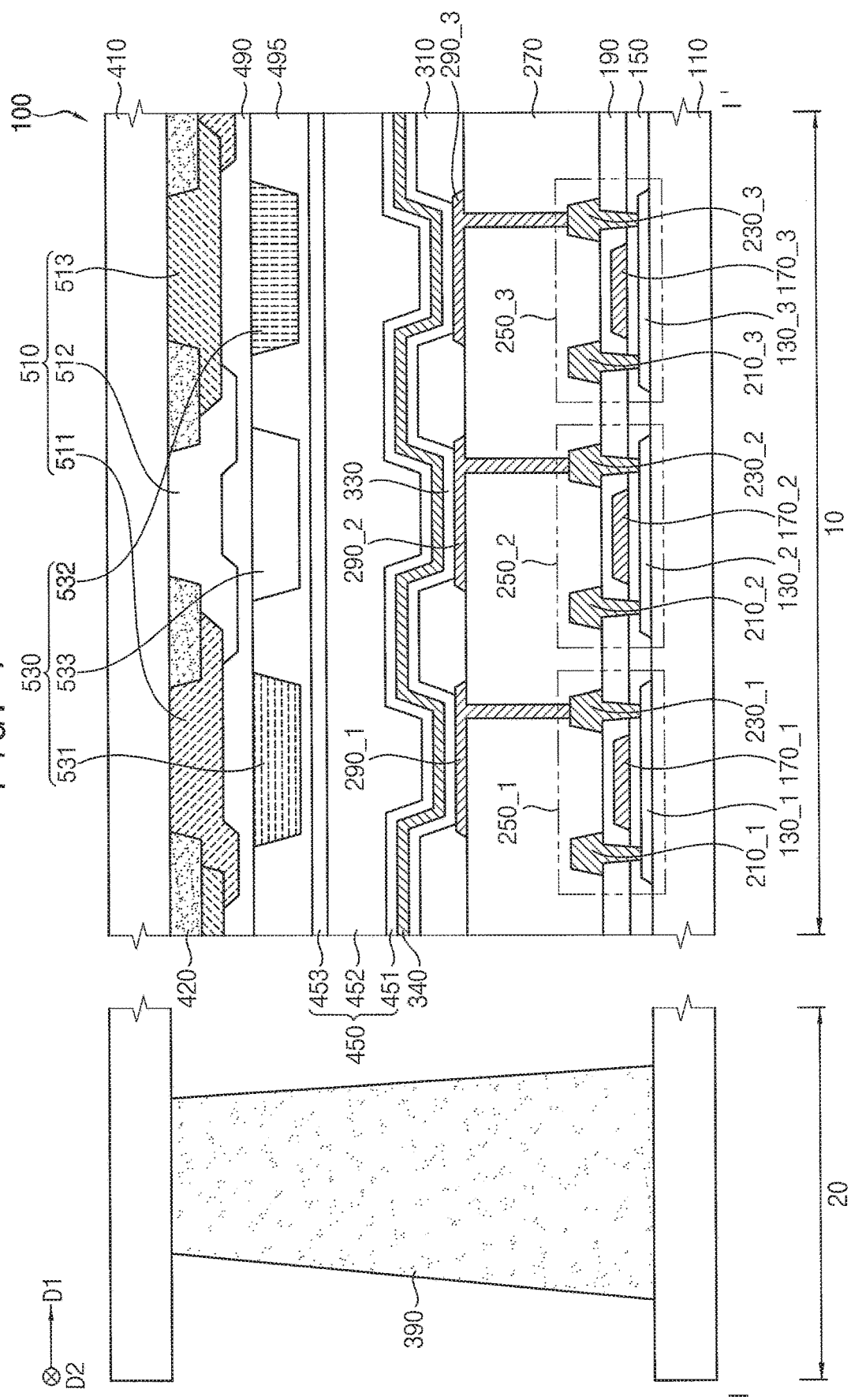
FIG. 7 is a sectional view taken along the line I-I' of FIG. 2.

Each of the sub-pixel areas 30 may be provided with one of first to third sub-pixel structures described in FIG. 7, and the display device 100 may display an image through the first to third sub-pixel structures. A sealing pattern 390, the alignment structure described in FIG. 7, and the like may be disposed in the peripheral area 20, and the disposed area may correspond to a non-display area. In addition, a plurality of transistors, a plurality of capacitors, a plurality of signal wirings (such as a gate signal wiring, a data signal wiring, a high power supply voltage wiring, a light emission signal wiring, and an initialization signal wiring) may be additionally disposed in the display area 10, and a plurality of signal wirings, a gate driver, a data driver, and the like may be additionally disposed in the peripheral area 20.

As shown in FIGS. 2 and 3, the light shielding pattern 420 may overlap the display area 10 and a part of the peripheral area 20, and disposed on the bottom surface of the upper substrate. In exemplary embodiments, the light shielding pattern 420 may include a first opening 421, a second opening 422, and third openings 423.

The first opening 421 and the second opening 422 may be disposed adjacent to each other and located in the peripheral area 20. In other words, the first and second openings 421 and 422 may be located adjacent to one of four corners of the light shielding pattern 420. In addition, the alignment structure may be disposed in the first and second openings 421 and 422. The alignment structure may include a plurality of layers, and may have a multi-layer structure in which at least two layers are laminated. For example, the alignment structure may have at least two layers partially overlapping each other. In addition, the third openings 423 may overlap the first to third sub-pixel structures. In other words, light emitted from the first to third sub-pixel structures may be emitted to the outside through the third openings 423.

In other exemplary embodiments, as shown in FIG. 4, the first and second openings 421 and 422 may be located at all of the four corners of the light shielding pattern 420. In other exemplary embodiments, as shown in FIG. 5, a plurality of first and second openings 421 and 422 may be located in the peripheral area 20 of the light shielding pattern 420.

The sealing pattern 390 may be disposed in the peripheral area 20 between the upper substrate and the lower substrate. The sealing pattern 390 may be spaced a predetermined distance apart from the shielding pattern 420 and may substantially surround the light shielding pattern 420. The upper substrate and the lower substrate may be coupled to each other by the sealing pattern 390.

Although the display area 10, the peripheral area 20, and the sub-pixel area 30 of the present inventive concept have been described as having a rectangular shape in a plan view, the shape is not limited thereto. For example, each of the display area 10, the peripheral area 20, and the sub-pixel area 30 may have a triangular shape, a rhombic shape, a polygonal shape, a circular shape, a track-type shape, or an oval shape viewed from the top.

Figure 6:
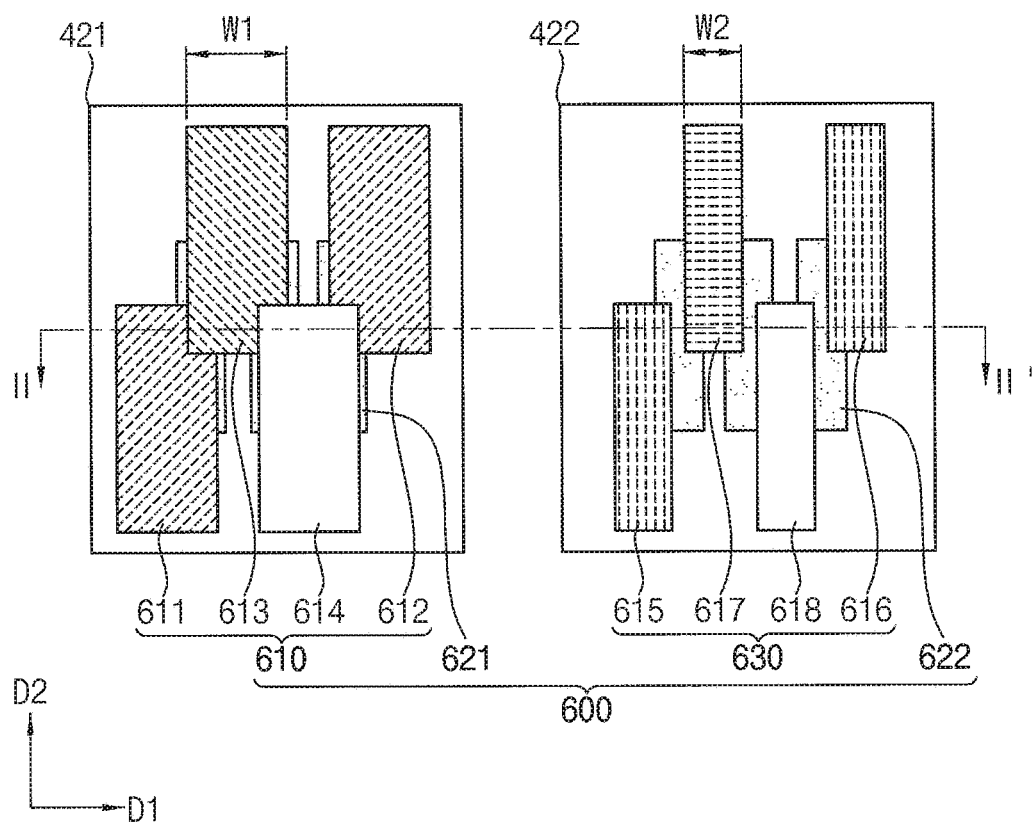
FIG. 6 is a plan view explaining alignment patterns disposed in the first and second openings of FIG. 3.
Figure 8:
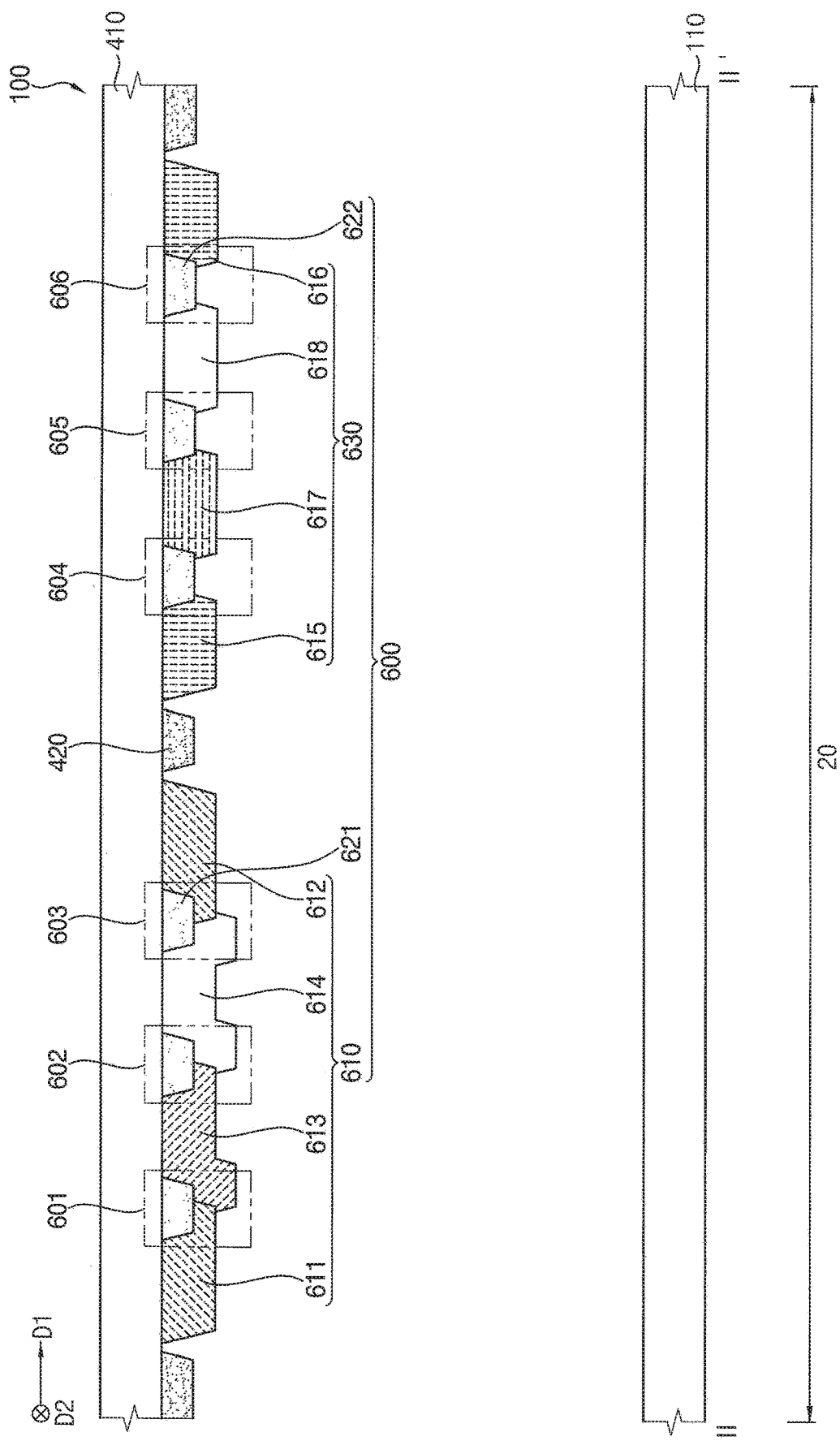
FIG. 8 is a sectional view taken along line II-IT of FIG. 6.

FIG. 6 is a plan view explaining alignment patterns disposed in the first and second openings of FIG. 3. FIG. 7 is a sectional view taken along the line I-I' of FIG. 2. FIG. 8 is a sectional view taken along line II-IT of FIG. 6.

Referring to FIGS. 6, 7 and 8, the display device 100 may include a lower substrate 110, a first semiconductor element 250_1, a second semiconductor element 250_2, a third semiconductor element 250_3, a gate insulating layer 150, an interlayer insulating layer 190, a planarization layer 270, a first lower electrode 290_1, a second lower electrode 290_2, a third lower electrode 290_3, a light emitting layer 330, an upper electrode 340, a thin film encapsulation structure 450, a second protective layer 495, an optical filter layer 530, a first protective layer 490, a color filter layer 510, a light shielding pattern 420, an alignment structure 600, a sealing pattern 390, an upper substrate 410, and the like.

The first lower electrode 290_1, the light emitting layer 330, and the upper electrode 340 are defined as a first sub-pixel structure, the second lower electrode 290_2, the light emitting layer 330, and the upper electrode 340 are defined as a second sub-pixel structure, and the third lower electrode 290_3, the light emitting layer 330, and the upper electrode 340 are defined as a third sub-pixel structure. In exemplary embodiments, the light shielding pattern 420 may have a first opening 421, a second opening 422, and third openings 423. In each of the first and second openings 421 and 422, the alignment structure 600 may be disposed to overlap the first and second openings 421 and 422. In the third openings 423, the first to third sub-pixel structures may be disposed to overlap the third openings 423.

The first semiconductor element 250_1 may include a first active layer 130_1, a first gate electrode 170_1, a first source electrode 210_1 and a first drain electrode 230_1, the second semiconductor element 250_2 may include a second active layer 130_2, a second gate electrode 170_2, a second source electrode 210_2, and a second drain electrode 230_2, and the third semiconductor element 250_3 may include a third active layer 130_3, a third gate electrode 170_3, a third source electrode 210_3, and a third drain electrode 230_3. In addition, the thin film encapsulation structure 450 may include a first thin film encapsulation layer 451, a second thin encapsulation layer 452 and a third thin encapsulation layer 453. The optical filter layer 530 may include a first quantum dot pattern 531, a scattering pattern 533 and a second quantum dot pattern 532 (such as optical filter patterns). The color filter layer 510 may include a first color filter pattern 511, a second color filter pattern 512, and a third color filter pattern 513. In addition, the alignment structure 600 may include color filter alignment patterns 610, first reference alignment patterns 621, optical filter alignment patterns 630, and second reference alignment patterns 622, in which the color filter alignment patterns 610 may include a first color filter alignment pattern 611, a fourth color filter alignment pattern 612, a second color filter alignment pattern 613, and a third color filter alignment pattern 614, and the optical filter alignment patterns 630 may include a first optical filter alignment pattern 615, a fourth optical filter alignment pattern 616, a second optical filter alignment pattern 617, and a third optical filter alignment pattern 618.

As described above, the display device 100 may include a display area 10 including a plurality of sub-pixel areas 30 and a peripheral area 20 surrounding the display area 10. When the display device 100 includes the display area 10 and the peripheral area 20, the lower substrate 110 may also include a display area 10 and a peripheral area 20 which respectively corresponds to the display area 10 and the peripheral area 20 of the display device 100.

The lower substrate 110 may include a transparent or opaque material. The lower substrate 110 may include a quartz substrate, a synthetic quartz substrate, a calcium fluoride substrate, a fluorine-doped (F-doped) quartz substrate, a sodalime glass substrate, a non-alkali glass substrate, or the like.

A buffer layer (not shown) may be disposed on the lower substrate 110. The buffer layer may be disposed entirely on the lower substrate 110. The buffer layer may prevent metal atoms or impurities from diffusing from the lower substrate 110 to the semiconductor element and the sub-pixel structure, and may enable a substantially uniform active layer to be obtained by adjusting the rate of heat transfer during a crystallization process for forming the active layer. In addition, when the lower substrate 110 has an uneven surface, the buffer layer may provide an even surface on the lower substrate 110. According to a type of substrate 110, at least two buffer layers may be provided on the substrate 110, or the buffer layer may not be disposed thereon. For example, the buffer layer may include an organic material or an inorganic material.

The first to third active layers 130_1, 130_2, and 130_3 may be disposed to be spaced apart from each other in the display area 10 on the lower substrate 110. Each of the first to third active layers 130_1, 130_2, and 130_3 may include an oxide semiconductor, an inorganic semiconductor (such as amorphous silicon and poly silicon), an organic semiconductor, or the like, and may include a source area and a drain area.

The gate insulating layer 150 may be disposed on the first to third active layers 130_1, 130_2, and 130_3. The gate insulating layer 150 may cover the first to third active layers 130_1, 130_2, and 130_3 in the display area 10 on the lower substrate 110, and may be disposed entirely cover the lower substrate 110. The gate insulating layer 150 may be disposed in the peripheral area 20 on the lower substrate 110.

For example, the gate insulating layer 150 may sufficiently cover the first to third active layers 130_1, 130_2, and 130_3 on the lower substrate 110, and may have a substantially planarized top surface without generating a step around the first to third active layers 130_1, 130_2, and 130_3. However, the gate insulating layer 150 may be disposed to have a uniform thickness along profiles of the first to third active layers 130_1, 130_2, and 130_3 while covering the first to third active layers 130_1, 130_2, and 130_3 on the lower substrate 110. The gate insulating layer 150 may include silicon compound, metal oxide, or the like. For example, the gate insulating layer 150 may include silicon oxide (SiOx), silicon nitride (SiNx), silicon oxynitride (SiOxNy), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), or the like. The gate insulating layer 150 may have a multi-layer structure including a plurality of insulating layers. For example, the insulating layers may have different thicknesses or include different materials.

The first to third gate electrodes 170_1, 170_2, and 170_3 may be disposed to be spaced apart from each other on the gate insulating layer 150. For example, the first gate electrode 170_1 may be disposed to overlap the first active layer 130_1, the second gate electrode 170_2 may be disposed to overlap the second active layer 130_2, and the third gate electrode 170_3 may be disposed to overlap the third active layer 130_3. Each of the first to third gate electrodes 170_1, 170_2, and 170_3 may include a metal, an alloy, a metal nitride, a conductive metal oxide, a transparent conductive material, or the like. For example, each of the first to third gate electrodes 170_1, 170_2, and 170_3 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Jr), an alloy containing aluminum, aluminum nitride (AlNx), an alloy containing silver, tungsten nitride (WNx), an alloy containing copper, an alloy containing molybdenum, titanium nitride (TiNx), chromium nitride (CrNx), tantalum nitride (TaNx), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), or the like. These may be used alone or in combination with each other. Each of the first to third gate electrodes 170_1, 170_2, and 170_3 may have a multi-layer structure including a plurality of layers.

The interlayer insulating layer 190 may be disposed on the first to third gate electrodes 170_1, 170_2, and 170_3. The interlayer insulating layer 190 may cover the first to third gate electrodes 170_1, 170_2, and 170_3 in the display area 10 on the gate insulating layer 150, and may be disposed entirely on the gate insulating layer 150. The interlayer insulating layer 190 may be disposed in the peripheral area 20 on the lower substrate 110.

For example, the interlayer insulating layer 190 may sufficiently cover the first to third gate electrodes 170_1, 170_2, and 170_3 on the gate insulating layer 150, and may have a substantially planarized top surface without generating a step around the first to third gate electrodes 170_1, 170_2, and 170_3. However, the interlayer insulating layer 190 may be disposed to have a uniform thickness along profiles of the first to third gate electrodes 170_1, 170_2, and 170_3 while covering the first to third gate electrodes 170_1, 170_2, and 170_3 on the gate insulating layer 150. The interlayer insulating layer 190 may include silicon compound, metal oxide, or the like. Selectively, the interlayer insulating layer 190 may have a multi-layer structure including a plurality of insulating layers. For example, the insulating layers may have different thicknesses or include different materials.

A first source electrode 210_1, a first drain electrode 230_1, a second source electrode 210_2, a second drain electrode 230_2, a third source electrode 210_3, and a third drain electrode 230_3 may be disposed to be spaced apart from each other in the display area 10 on the interlayer insulating layer 190. For example, the first source electrode 210_1 may be connected to a source area of the first active layer 130_1 through a contact hole formed by removing a first portion of the gate insulating layer 150 and the interlayer insulating layer 190, and the first drain electrode 230_1 may be connected to a drain area of the first active layer 130_1 through a contact hole formed by removing a second portion of the gate insulating layer 150 and the interlayer insulating layer 190. In addition, the second source electrode 210_2 may be connected to a source area of the second active layer 130_2 through a contact hole formed by removing a third portion of the gate insulating layer 150 and the interlayer insulating layer 190, and the second drain electrode 230_2 may be connected to a drain area of the second active layer 130_2 through a contact hole formed by removing a fourth portion of the gate insulating layer 150 and the interlayer insulating layer 190. In addition, the third source electrode 210_3 may be connected to a source area of the third active layer 130_3 through a contact hole formed by removing a fifth portion of the gate insulating layer 150 and the interlayer insulating layer 190, and the third drain electrode 230_3 may be connected to a drain area of the third active layer 130_3 through a contact hole formed by removing a sixth portion of the gate insulating layer 150 and the interlayer insulating layer 190. The first to third source electrodes 210_1, 210_2, and 210_3 and the first to third drain electrodes 230_1, 230_2, and 230_3 may include a metal, an alloy, a metal nitride, a conductive metal oxide, a transparent conductive material, or the like. These may be used alone or in combination with each other. Selectively, the first to third source electrodes 210_1, 210_2, and 210_3 and the first to third drain electrodes 230_1, 230_2, and 230_3 may have a multi-layer structure including a plurality of layers.

Accordingly, the first semiconductor element 250_1 including the first active layer 130_1, the first gate electrode 170_1, the first source electrode 210_1 and the first drain electrode 230_1 may be disposed, the second semiconductor element 250_2 including the second active layer 130_2, the second gate electrode 170_2, the second source electrode 210_2 and the second drain electrode 230_2 may be disposed, and the third semiconductor element 250_3 including the third active layer 130_3, the third gate electrode 170_3, the third source electrode 210_3 and the third drain electrode 230_3 may be disposed on the lower substrate 110.

Although the display device 100 has been described as having three transistors (such as first to third semiconductor elements 250-1, 250_2, and 250_3), the configuration of the present inventive concept is not limited thereto. For example, the display device 100 may include a plurality of transistors and at least a plurality of capacitors.

In addition, although each of the first to third semiconductor elements 250_1, 250_2, and 250_3 has been described as having a top gate structure, the configuration of the present inventive concept is not limited thereto. For example, each of the first to third semiconductor elements 250_1, 250_2, and 250_3 may have a bottom gate structure and/or a dual gate structure.

Each of the first to third semiconductor elements 250_1, 250_2, and 250_3 may further include the gate insulating layer 150 and the interlayer insulating layer 190.

The planarization layer 270 may be disposed in the display area 10 on the interlayer insulating layer 190 and the first to third semiconductor elements 250_1, 250_2 and 250_3, and may not be disposed in the peripheral area 20. The planarization layer 270 may have a thickness to sufficiently cover the first to third source electrodes 210_1, 210_2, and 210_3 and the first to third drain electrodes 230_1, 230_2, and 230_3 on the interlayer insulating layer 190. In this case, the planarization layer 270 may have a substantially planarized top surface when it is formed. When the planarization layer 270 has an uneven top surface when it is formed, a planarization process may be further performed to planarize the uneven top surface. The planarization layer 270 may include an organic material or an inorganic material. In exemplary embodiments, the planarization layer 270 may include an organic material.

The first to third lower electrodes 290_1, 290_2, and 290_3 may be disposed to be spaced apart from each other in the display area 10 on the planarization layer 270. For example, the first lower electrode 290_1 may be disposed in a first portion of the planarization layer 270, the second lower electrode 290_2 may be disposed in a second portion of the planarization layer 270, and the third lower electrode 290_3 may be disposed in a third portion of the planarization layer 270. The third portion of the planarization layer 270 may be spaced apart from the first portion, and the second portion of the planarization layer 270 may be located between the first portion and the third portion. The first, second and third portions may overlap the third openings 423 of the light shielding pattern 420.

The first to third lower electrodes 290_1, 290_2, and 290_3 may be connected to the first to third drain electrodes 230_1, 230_2, and 230_3 through contact holes formed in the planarization layer 270, respectively. In other words, the first to third lower electrodes 290_1, 290_2, and 290_3 may be electrically connected to the first to third semiconductor elements 250_1, 250_2, and 250_3, respectively. The first to third lower electrodes 290_1, 290_2, and 290_3 may include a metal, an alloy, a metal nitride, a conductive metal oxide, a transparent conductive material, or the like. These may be used alone or in combination with each other. Selectively, the first to third lower electrodes 290_1, 290_2, and 290_3 may have a multi-layer structure including a plurality of layers.

A pixel defining layer 310 may be disposed in the display area 10 on parts of the first to third lower electrodes 290_1, 290_2, and 290_3 and on the planarization layer 270, and may not be disposed in the peripheral area 20. The pixel defining layer 310 may cover edges of each of the first to third lower electrodes 290_1, 290_2, and 290_3, and may expose a part of an upper surface of each of the first to third lower electrodes 290_1, 290_2, and 290_3. The pixel defining layer 310 may be formed of an organic material or an inorganic material. In exemplary embodiments, the pixel defining layer 310 may include an organic material.

The light emitting layer 330 may be disposed in the display area 10 on the first to third lower electrodes 290_1, 290_2, and 290_3 exposed by the pixel defining layer 310. In other words, the light emitting layer 330 may be continuously disposed in the display area 10 on the lower substrate 110, and may integrally formed in the display area 10. In exemplary embodiments, the light emitting layer 330 may be formed using a light emitting material capable of emitting blue light. On the contrary, the light emitting layer 330 may be formed by laminating a plurality of light emitting materials capable of generating other color light such as red light, green light, and blue light, so that white light may be emitted as a whole.

The upper electrode 340 may be disposed in the display area 10 on the pixel defining layer 310 and the light emitting layer 330. The upper electrode 340 may include a metal, an alloy, a metal nitride, a conductive metal oxide, a transparent conductive material, or the like. These may be used alone or in combination with each other. Selectively, the upper electrode 340 may have a multi-layer structure including a plurality of layers.

Accordingly, the first sub-pixel structure including the first lower electrode 290_1, the light emitting layer 330, and the upper electrode 340 may be disposed, the second sub-pixel structure including the second lower electrode 290_2, the light emitting layer 330, and the upper electrode 340 may be disposed, and the third sub-pixel structure including the third lower electrode 290_3, the light emitting layer 330, and the upper electrode 340 may be disposed on the lower substrate 110.

The first thin film encapsulation layer 451 may be disposed on the upper electrode 340. The first thin film encapsulation layer 451 may be disposed to have a uniform thickness along a profile of the upper electrode 340 while covering the upper electrode 340. The first thin film encapsulation layer 451 may be disposed in the peripheral area 20 on the lower substrate 110. The first thin film encapsulation layer 451 may prevent the first to third sub-pixel structures from deteriorating due to the permeation of the moisture, oxygen, or the like. In addition, the first thin film encapsulation layer 451 may also function to protect the first to third sub-pixel structures from an external impact. The first thin film encapsulation layer 451 may include flexible inorganic materials.

A second thin film encapsulation layer 452 may be disposed on the first thin film encapsulation layer 451. The second thin film encapsulation layer 452 may improve the flatness of the display device 100, and may protect the first to third sub-pixel structures. The second thin film encapsulation layer 452 may include flexible organic materials.

A third thin film encapsulation layer 453 may be disposed on the second thin film encapsulation layer 452. The third thin film encapsulation layer 453 may be disposed to have a uniform thickness along a profile of the second thin film encapsulation layer 452 while covering the second thin film encapsulation layer 452. The third thin film encapsulation layer 453 may be disposed in the peripheral area 20 on the lower substrate 110. The third thin film encapsulation layer 453 together with the first thin film encapsulation layer 451 may prevent the first to third sub-pixel structures from deteriorating due to the permeation of the moisture, oxygen, or the like. In addition, the third thin film encapsulation layer 453, together with the first thin film encapsulation layer 451 and the second thin film encapsulation layer 452, may also function to protect the first to third sub-pixel structures from the external impact. The third thin film encapsulation layer 453 may include flexible inorganic materials.

Accordingly, the thin film encapsulation structure 450 including the first thin film encapsulation layer 451, the second thin film encapsulation layer 452 and the third thin film encapsulation layer 453 may be disposed on the lower substrate 110. The thin film encapsulation structure 450 may be configured in a five-layer structure formed by laminating first to fifth thin film encapsulation layers or a seven-layer structure formed by laminating first to seventh thin film encapsulation layers in which an inorganic layer and an organic layer are alternatingly disposed.

The upper substrate 410 may be disposed on the thin film encapsulation structure 450. The upper substrate 410 may be disposed to face the lower substrate 110. The upper substrate 410 and the lower substrate 110 may include substantially the same material. For example, the upper substrate 410 may include a quartz substrate, a synthetic quartz substrate, a calcium fluoride substrate, a fluorine-doped quartz substrate, a sodalime glass substrate, a non-alkali glass substrate, or the like.

As shown in FIGS. 7 and 8, the light shielding pattern 420 may be disposed in parts of the display area 10 and the peripheral area 20 on the bottom surface of the upper substrate 410. In other words, the light shielding pattern 420 may be disposed between the upper substrate 410 and the optical filter layer 530. As described above, the light shielding pattern 420 may have the third openings 423 in the display area 10 and may have the first opening 421 and the second opening 422 in the peripheral area 20. The third openings 423 may overlap each of the first to third sub-pixel structures, color filter alignment patterns 610 may be disposed in the first opening 421, and optical filter alignment patterns 630 may be disposed in the second opening 422. The shielding pattern 420 may include an organic material such as photoresist, polyacryl-based resin, polyimide-based resin, polyamide-based resin, siloxane-based resin, acryl-based resin, and epoxy-based resin. In addition, the light shielding pattern 420 may be substantially opaque. For example, the light shielding pattern 420 may further include a light shielding material to absorb light. The light shielding material may include carbon black, titanium nitride oxide, titanium black, phenylene black, aniline black, cyanine black, nigrosine acid black, black resin, or the like.

The color filter layer 510 may be disposed in the third openings 423 of the light shielding pattern 420. In other words, the color filter layer 510 may be disposed on the bottom surface of the upper substrate 410 in the third openings 423 to overlap the third openings 423 in a plan view. In exemplary embodiments, the color filter layer 510 may partially overlap the light shielding pattern 420. The color filter layer 510 may include a first color filter pattern 511 for transmitting green light, a second color filter pattern 512 for transmitting blue light, and a third color filter pattern 513 for transmitting red light. In exemplary embodiments, each of the first color filter pattern 511, the second color filter pattern 512, and the third color filter pattern 513 may have a first width.

For example, the first color filter pattern 511 may be disposed in a third opening 423 located at a left side of the third openings 423 shown in FIG. 7, the second color filter pattern 512 may be disposed in a third opening 423 located at a center of the third openings 423 shown in FIG. 7, and the third color filter pattern 513 may be disposed in a third opening 423 located at a right side of the third openings 423 shown in FIG. 7. In other words, the first color filter pattern 511 may be disposed on the first quantum dot pattern 531 to overlap the first quantum dot pattern 531 in a plan view, the second color filter pattern 512 may be disposed on the scattering pattern 533 to overlap the scattering pattern 533 in a plan view, and the third color filter pattern 513 may be disposed on the second quantum dot pattern 532 to overlap the second quantum dot pattern 532 in a plan view. The first color filter pattern 511, the second color filter pattern 512, and the third color filter pattern 513 may be repeatedly arranged on the bottom surface of the upper substrate 410. Accordingly, a part of the third color filter pattern disposed at a left side of the first color filter pattern 511 may be disposed between the first color filter pattern 511 and the light shielding pattern 420 (see FIG. 13), and a part of the first color filter pattern disposed at a right side of the third color filter pattern 513 may be disposed on the third color filter pattern 513 (see FIG. 15).

In exemplary embodiments, the first color filter pattern 511 (or both side portions of the first color filter pattern 511) may simultaneously overlap a part of the third color filter pattern disposed at the left side and a part of the second color filter pattern 512 (or one side of the second color filter pattern 512), and a shape of the first color filter pattern 511 may be the same as a shape of the second color filter alignment pattern 613.

The third color filter pattern 513 (or both side portions of the third color filter pattern 513) may simultaneously overlap a part of the first color filter pattern disposed at the right side and a part of the second color filter pattern 512 (or the other side of the second color filter pattern 512), a shape of the third color filter pattern 513 may be the same as a shape of the fourth color filter alignment pattern 613, and a shape of the third color filter pattern 513 disposed at the left side may be the same as a shape of a part of the first color filter alignment pattern 611.

The second color filter pattern 512 (or both side portions of the second color filter pattern 512) may simultaneously overlap a part of the first color filter pattern 511 (or one side of the first color filter pattern 511) and a part of the third color filter pattern 513 (or one side of the third color filter pattern 513), and a shape of the second color filter pattern 512 may be the same as a shape of the third color filter alignment pattern 614.

In addition, the first color filter pattern 511 may have a green color, the second color filter pattern 512 may have a blue color, and the third color filter pattern 513 may have a red color. The color filter layer 510 may include photosensitive resin and color photoresist.

Although the color filter layer 510 of the present inventive concept has been described as including a green color filter pattern, a blue color filter pattern, and a red color filter pattern, the configuration of the present inventive concept is not limited thereto. For example, the color filter layer 510 may include a yellow color filter pattern, a cyan color filter pattern, and a magenta color filter pattern.

In addition, although the green color filter pattern, the blue color filter pattern, and the red color filter pattern of the present inventive concept have been described as being sequentially arranged, the configuration of the present inventive concept is not limited thereto. For example, the arrangement of the color filter patterns may be altered as required.

Referring to FIGS. 6 and 8 again, color filter alignment patterns 610 each having a first width W1 along a first direction D1 and first reference alignment patterns 621 may be disposed in the first opening 421 of the light shielding pattern 420. In other words, the color filter alignment patterns 610 and the first reference alignment patterns 621 may be disposed on the bottom surface of the upper substrate 410 in the first opening 421. Adjacent two color filter alignment patterns 610 among the color filter alignment patterns 610 may overlap each other. The color filter alignment patterns 610 may include the first color filter alignment pattern 611 and the fourth color filter alignment pattern 612 transmitting a red color light, the second color filter alignment pattern 613 transmitting a green color light, and the third color filter alignment pattern 614 transmitting a blue color light. In addition, the first reference alignment patterns 621 may have a black color.

For example, the first reference alignment patterns 621 may be spaced apart from each other in the first opening 421. In other words, the first reference alignment patterns 621 may be disposed to be spaced apart from each other between the first to fourth color filter alignment patterns 611, 613, 614, and 612 and the upper substrate 410. The first reference alignment patterns 621 may include a plurality of first reference alignment patterns 621 sequentially disposed along a first direction. The plurality of first reference alignment patterns 621 may include a left first reference alignment pattern, a right first reference alignment pattern and a center first reference alignment pattern disposed between the left first reference alignment patterns 621 and a right first reference alignment patterns 621.

The first color filter alignment pattern 611 may be disposed to partially overlap the left first reference alignment pattern 621 located at the left side of the first reference alignment patterns 621. For example, one side of the first color filter alignment pattern 611 may overlap the left first reference alignment pattern 621 located at the left side. The other side of the first color filter alignment pattern 611 may be disposed between one edge of the first opening 421 and the left first reference alignment pattern 621. The fourth color filter alignment pattern 612 may be disposed between the right first reference alignment pattern 621 and the other edge of the first opening 421 which oppose the one edge of the first opening 421 to partially overlap the right first reference alignment pattern 621 located at the right side of the first reference alignment patterns 621. For example, one side of the fourth color filter alignment pattern 612 may overlap the right first reference alignment pattern 621 located at the right side. In other words, the first color filter alignment pattern 611 may be spaced apart from the fourth color filter alignment pattern 612 along a first direction D1.

The second color filter alignment pattern 613 may be disposed between the left first reference alignment pattern 621 and the center first reference alignment patterns 621, and may partially overlap the left first reference alignment pattern 621 and the center first reference alignment pattern 621 along a first direction. In other words, the second color filter alignment pattern 613 may be disposed between the first color filter alignment pattern 611 and the fourth color filter alignment pattern 612. In addition, the second color filter alignment pattern 613 may overlap the one side of the first color filter alignment pattern 611 on the left first reference alignment pattern 621 located at the left side, such that one side of the second color filter alignment pattern 613 is disposed on the one side of the first color filter alignment pattern 611. The overlapping portion is defined as a first overlapping portion 601.

The third color filter alignment pattern 614 may be disposed between the center first reference alignment pattern 621 located at the center and the right first reference alignment pattern 621 located at the right side, and may be disposed to partially overlap the center first reference alignment pattern 621 located at the center and the right first reference alignment pattern 621 located at the right side. In other words, the third color filter alignment pattern 614 may be disposed between the second color filter alignment pattern 613 and the fourth color filter alignment pattern 612. In addition, the third color filter alignment pattern 614 may overlap the other side of the second color filter alignment pattern 613 on the center first reference alignment pattern 621 located at the center, such that one side of the third color filter alignment pattern 614 is disposed on the other side of the second color filter alignment pattern 613. The overlapping portion is defined as a second overlapping portion 602. In addition, the other side of the third color filter alignment pattern 614 may overlap the one side of the fourth color filter alignment pattern 612 on the right first reference alignment pattern 621 located at the right side such that the other side of the third color filter alignment pattern 614 is disposed on the one side of the fourth color filter alignment pattern 612. The overlapping portion is defined as a third overlapping portion 603.

In exemplary embodiments, the third color filter pattern 513, the first color filter alignment pattern 611 and the fourth color filter alignment pattern 612 may be simultaneously formed using the same material, and the first width of the third color filter pattern 513 along the first direction D1 may be the same as the first width W1 of each of the first color filter alignment pattern 611 and the fourth color filter alignment pattern 612 along the first direction D1. In addition, the first color filter pattern 511 may be simultaneously formed using the same material as the second color filter alignment pattern 613, and the first width of the first color filter pattern 511 along the first direction D1 may be the same as the first width W1 of the second color filter alignment pattern 613 along a first direction D1. The second color filter pattern 512 and the third color filter alignment pattern 614 may be simultaneously formed using the same material, and the first width of the second color filter pattern 512 along the first direction D1 may be the same as the first width W1 of the third color filter alignment pattern 614 along a first direction D1. In addition, the first reference alignment patterns 621 may be simultaneously formed using the same material as the light shielding pattern 420, and a width of each of the first reference alignment patterns 621 may be the same as a width of the light shielding pattern 420 located between the adjacent third openings 423. However, each of the third color filter pattern 513, the first color filter alignment pattern 611, and the fourth color filter alignment pattern 612 may have the first width, each of the first color filter pattern 511 and the second color filter alignment pattern 613 may have a second width different from the first width, and each of the second color filter pattern 512 and the third color filter alignment pattern 614 may have a third width different from the first width and the second width. In other words, the first to third color filter patterns 511, 512, and 513 may have different widths.

In exemplary embodiments, the display device 100 includes a first opening 421 in the light shielding pattern 420 which exposes the color filter alignment patterns 610 and the first reference alignment patterns 621. Thus the widths of the first to fourth color filter alignment patterns 611, 613, 614, and 612 and the widths of the first overlapping portion 601, the second overlapping portion 602 and the third overlapping portion 603 may be checked, so that it can be confirmed whether the color filter layer 510 and the light shielding pattern 420 are accurately aligned each other.

Although the color filter alignment patterns 610 of the present inventive concept have been described as having four alignment patterns, the configuration of the present inventive concept is not limited thereto. For example, the color filter alignment patterns 610 may include three alignment patterns or at least five alignment patterns. For example, when the color filter alignment patterns 610 include three alignment patterns, the color filter alignment patterns 610 may include the first color filter alignment pattern 611, the second color filter alignment pattern 613 and the third color filter alignment pattern 614.

In addition, although the red color filter alignment pattern, the green color filter alignment pattern, the blue color filter alignment pattern, and the red color filter alignment pattern of the present inventive concept have been described as being sequentially arranged, the configuration of the present inventive concept is not limited thereto. For example, the arrangement may be altered as required.

Referring to FIG. 7 again, the first protective layer 490 may be disposed in the display area 10 on the bottom surface of the upper substrate 410 to cover the light shielding pattern 420 and the color filter layer 510. The protective layer 490 may not be disposed in the peripheral area 20. For example, the first protective layer 490 may have a thickness thick enough to sufficiently cover the light shielding pattern 420 and the color filter layer 510 on the bottom surface of the upper substrate 410. In other words, the first protective layer 490 may be disposed on the second protective layer 495. The first protective layer 490 may include an organic material or an inorganic material. In exemplary embodiments, the first protective layer 490 may include an organic material.

The optical filter layer 530 may overlap the color filter layer 510 in a plan view and disposed on the bottom surface of the first protective layer 490. In other words, the optical filter layer 530 may be disposed to overlap the third openings 423. The optical filter layer 530 may include a first quantum dot pattern 531 for converting blue light into green light, a scattering pattern 533 for transmitting the blue light, and a second quantum dot pattern 532 for converting the blue light into red light. In exemplary embodiments, the first quantum dot pattern 531, the scattering pattern 533, and the second quantum dot pattern 532 may have a second width smaller than the first width.

For example, the first quantum dot pattern 531 may be disposed below the first color filter pattern 511 while overlapping the first color filter pattern 511, the scattering pattern 533 may be disposed below the second color filter pattern 512 while overlapping the second color filter pattern 512, and the second quantum dot pattern 532 may be disposed below the third color filter pattern 513 while overlapping the third color filter pattern 513. In other words, the first quantum dot pattern 531 may be disposed on the first sub-pixel structure, the scattering pattern 533 may be disposed on the second sub-pixel structure, and the second quantum dot pattern 532 may be disposed on the third sub-pixel structure.

In exemplary embodiments, the first quantum dot pattern 531, the scattering pattern 533, and the second quantum dot pattern 532 may be spaced apart from each other, and may have the same thickness. The first quantum dot pattern 531 may include a plurality of quantum dots that absorb blue light and emit green light, the scattering pattern 533 may include a scattering material that emits blue light as absorbed, and the second quantum dot pattern 532 may include a plurality of quantum dots that absorb blue light and emit red light.

For example, the quantum dots included in the first quantum dot pattern 531 and the second quantum dot pattern 532 may include any one among silicon-based nanocrystal, II-VI group-based compound semiconductor nanocrystal, III-V group-based compound semiconductor nanocrystal, IV-VI group-based compound semiconductor nanocrystal, and a mixture thereof. The II-VI group-based compound semiconductor nanocrystal may include one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. The III-V group-based compound semiconductor nanocrystal may include one selected from the group consisting of GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaIn-PAs, InAlNP, InAlNAs, and InAlPAs. The IV-VI group-based compound semiconductor nanocrystal may be SbTe.

Even when the quantum dots included in the first and second quantum dot patterns 531 and 532 include the same material, a spectrum wavelength may vary according to a size of the quantum dot. For example, when the size of the quantum dot is smaller, light having a shorter wavelength may be emitted. Accordingly, the sizes of the quantum dots included in the first and second quantum dot patterns 531 and 532 are adjusted, so that light having a desired visible light band may be emitted.

In exemplary embodiments, the quantum dots included in the first quantum dot pattern 531 and the second quantum dot pattern 532 may be formed of the same material, and the size of the quantum dot included in the first quantum dot pattern 531 may be smaller than the size of the quantum dot included in the second quantum dot pattern 532.

The scattering pattern 533 may include TiO, ZrO, AlO3, In2O3, ZnO, SnO2, Sb2O3, ITO, or the like. However, the material of the scattering pattern 533 is not limited thereto, and may be variously modified as long as the material scatters blue light without conversion.

Although the first quantum dot pattern 531, the scattering pattern 533, and the second quantum dot pattern 532 of the present inventive concept have been described as being sequentially arranged, the configuration of the present inventive concept is not limited thereto. For example, the arrangement of the first quantum dot pattern 531, the scattering pattern 533 and the second quantum dot pattern 532 may be altered as required.

Referring to FIGS. 6 and 8 again, optical filter alignment patterns 630 having the second width W2 and second reference alignment patterns 622 may be disposed in the second opening 422 of the light shielding pattern 420. In other words, the optical filter alignment patterns 630 and the second reference alignment patterns 622 may be disposed on the bottom surface of the upper substrate 410 in the second opening 422. The optical filter alignment patterns 630 may be spaced apart from each other. The optical filter alignment patterns 630 may include first and fourth optical filter alignment pattern 615 and 616 emitting a red color light, a second optical filter alignment pattern 617 emitting a green color light, and a third optical filter alignment pattern 618 emitting a blue color light. In addition, the second reference alignment patterns 622 may have a black color.

For example, the second reference alignment patterns 622 may be spaced apart from each other along the first direction D1 in the second opening 422. In other words, the second reference alignment patterns 622 may be disposed between fifth to eighth optical filter alignment patterns 615, 617, 618, 616 and the upper substrate 410.

The first optical filter alignment pattern 615 may be disposed to partially overlap a left second reference alignment pattern 622 located at a left side of the second reference alignment patterns 622. For example, one side of the first optical filter alignment pattern 615 may overlap the left first reference alignment patterns 621 located at the left side. The fourth optical filter alignment pattern 616 may be disposed to partially overlap the right second reference alignment pattern 622 located at a right side of the second reference alignment patterns 622. For example, one side of the fourth optical filter alignment pattern 616 may overlap the right second reference alignment pattern 622 located at the right side. In other words, the first optical filter alignment pattern 615 and the fourth optical filter alignment pattern 616 may be spaced apart from each other.

The second optical filter alignment pattern 617 may be disposed between a center second reference alignment pattern 622 located at a center of the second reference alignment patterns 622 and the left second reference alignment pattern 622 located at the left side, and may partially overlap the left second reference alignment pattern 622 located at the left side and the center second reference alignment pattern 622 located at the center. In other words, the second optical filter alignment pattern 617 may be disposed between the first optical filter alignment pattern 615 and the fourth optical filter alignment pattern 616. In addition, the one side of the first optical filter alignment pattern 615 and the one side of the second optical filter alignment pattern 617 may be spaced apart from each other on the left second reference alignment pattern 622 located at the left side. The spaced portion is defined as a first spaced portion 604.

The third optical filter alignment pattern 618 may be disposed between the center second reference alignment pattern 622 located at the center and the right second reference alignment pattern 622 located at the right side, and may partially overlap the center second reference alignment pattern 622 located at the center and the right second reference alignment pattern 622 located at the right side. In other words, the third optical filter alignment pattern 618 may be disposed between the second optical filter alignment pattern 617 and the fourth optical filter alignment pattern 616. In addition, the other side of the second optical filter alignment pattern 617 and one side of the third optical filter alignment pattern 618 may be spaced apart from each other on the center second reference alignment pattern 622 located at the center. The spaced portion is defined as a second spaced portion 605. Further, the other side of the third optical filter alignment pattern 618 and the one side of the fourth optical filter alignment pattern 616 may be spaced apart from each other on the right second reference alignment pattern 622 located at the right side. The spaced portion is defined as a third spaced portion 606.

In exemplary embodiments, the scattering pattern 533 and the third optical filter alignment pattern 618 may be simultaneously formed using the same material, and the second width of the scattering pattern 533 along the first direction D1 may be the same as a second width W2 of the third optical filter alignment pattern 618 along the first direction D1. In addition, the second quantum dot pattern 532, the first optical filter alignment pattern 615, and the fourth optical filter alignment pattern 616 may be simultaneously formed using the same material, and the second width of the second quantum dot pattern 532 along the first direction D1 may be the same as the second widths W2 of the first optical filter alignment pattern 615 and the fourth optical filter alignment pattern 616 along the first direction D1. The first quantum dot pattern 531 and the second optical filter alignment pattern 617 may be simultaneously formed using the same material, and the second width of the second quantum dot pattern 532 along the first direction D1 may be the same as the second width W2 of the second optical filter alignment pattern 617 along the first direction D1. Further, the second reference alignment patterns 622 may be simultaneously formed using the same material as the light shielding pattern 420 and the first reference alignment patterns 621, and the widths of the second reference alignment patterns 622 may be the same as the width of the light shielding pattern 420 located between adjacent third openings 423 and the widths of the first reference alignment patterns 621. However, each of the scattering pattern 533 and the third optical filter alignment pattern 618 may have a first width along the first direction D1, each of the second quantum dot pattern 532, the first optical filter alignment pattern 615, and the fourth optical filter alignment pattern 616 may have a second width different from the first width along the first direction D1, and each of the first quantum dot pattern 531 and the second optical filter alignment pattern 617 may have a third width different from the first width and the second width along the first direction D1. In other words, the first quantum dot pattern 531, the second quantum dot pattern 532, and the scattering pattern 533 may have different widths.

In exemplary embodiments, the display device 100 includes a second opening 422 in the light shielding pattern 420 which exposes the optical filter alignment patterns 630 and the second reference alignment patterns 622. Thus the widths of the fifth to eighth optical filter alignment patterns

615, 617, 618, and 616, and the widths of the first spaced portion 604, the second spaced portion 605 and the third spaced portion 606 may be checked, so that it can be confirmed whether the optical filter layer 530 and the light shielding pattern 420 are accurately aligned each other.

Although the optical filter alignment patterns 630 of the present inventive concept have been described as having four alignment patterns, the configuration of the present inventive concept is not limited thereto. For example, the optical filter alignment patterns 630 may include three alignment patterns or at least five alignment patterns. For example, when the optical filter alignment patterns 630 include three alignment patterns, the optical filter alignment patterns 630 may include the first optical filter alignment pattern 615, the second optical filter alignment pattern 617, and the third optical filter alignment pattern 618.

In addition, although the red alignment pattern, the green alignment pattern, the blue alignment pattern, and the red alignment pattern of the present inventive concept have been described as being sequentially arranged, the configuration of the present inventive concept is not limited thereto. For example, the arrangement may be altered as required.

Referring to FIG. 7 again, the second protective layer 495 may be disposed in the display area 10 on a bottom surface of the first protective layer 490 to cover the optical filter layer 530, and may not be disposed in the peripheral area 20. For example, the second protective layer 495 may have a thickness enough to sufficiently cover the optical filter layer 530 on the bottom surface of the first protective layer 490. In other words, the second protective layer 495 may be disposed on the thin film encapsulation structure 450. The second protective layer 495 may include an organic material or an inorganic material. In exemplary embodiments, the second protective layer 495 may include an organic material.

The sealing pattern 390 may be disposed in the peripheral area 20 between the lower substrate 110 and the upper substrate 410. For example, the sealing pattern 390 may be spaced a predetermined distance apart from the light shielding pattern 420 and may substantially surround the light shielding pattern 420. The sealing pattern 390 may have a trapezoidal shape in a cross-sectional view. In addition, the sealing pattern 390 may come into direct contact with the bottom surface of the upper substrate 410 and the top surface of the lower substrate 110. However, at least one insulating layer (such as a gate insulating layer 150, an interlayer insulating layer 190, a first thin film encapsulation layer 451, and a third thin film encapsulation layer 453) may be interposed between the bottom surface of the sealing pattern 390 and the top surface of the lower substrate 110.

In exemplary embodiments, the sealing pattern 390 may include a non-conductive material. For example, the sealing pattern 390 may include a frit or the like. In addition, the sealing pattern 390 may additionally include a photocurable material. For example, the sealing pattern 390 may include a mixture of an organic material and a photocurable material, and the sealing pattern 390 may be obtained by irradiating the mixture with ultraviolet rays (UV), laser light, visible light, or the like and then curing the mixture. The photocurable material included in the sealing pattern 390 may include epoxy acrylate-based resin, polyester acrylate-based resin, urethane acrylate-based resin, polybutadiene acrylate-based resin, silicone acrylate-based resin, alkyl acrylate-based resin, or the like.

For example, the mixture of the organic material and the photocurable material may be irradiated with laser light. Upon the irradiation of laser light, the mixture may be changed from a solid state to a liquid state, and the mixture in the liquid state may be cured into the solid state after a predetermined time. The upper substrate 410 may be sealed and coupled to the lower substrate 110 according to the state change of the mixture.

Although the sealing pattern 390 has been described as having a trapezoidal shape in which a width of the top surface thereof is smaller than a width of the bottom surface, the configuration of the present inventive concept is not limited thereto. For example, the sealing pattern 390 may have a trapezoidal shape having the width of the top surface greater than the width of the bottom surface, a rectangular shape, a square shape, or the like.

The display device 100 according to the exemplary embodiments of the present inventive concept includes the alignment structure 600 disposed on the bottom surface of the upper substrate 410, so that it can be confirmed whether the color filter layer 510 and the optical filter layer 530 are accurately formed in the display area 10 on the bottom surface of the upper substrate 410. Accordingly, the defective rate of the display device 100 can be reduced.

Although the display device 100 of the present inventive concept has been described as an organic light emitting display device, the configuration of the present inventive concept is not limited thereto. In other exemplary embodiments, the display device 100 may include a liquid crystal display (LCD), a field emission display (FED), a plasma display panel (PDP), and an electrophoretic display device (EPD). For example, the upper substrate 410 on which the alignment structure 600, the optical filter layer 530, the color filter layer 510 and the like are disposed may be used as an upper substrate of the liquid crystal display device, the field emission display device, the plasma display panel, and the electrophoretic display device.

FIGS. 9 to 25 are sectional views showing a method of manufacturing the display device according to the exemplary embodiments of the present inventive concept.

Figure 9:
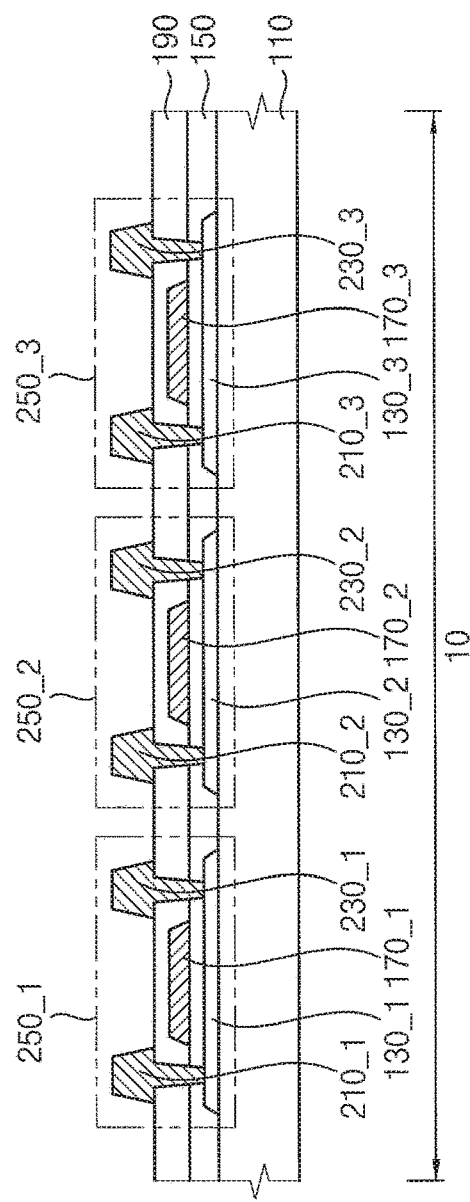
FIGS. 9, 10, 11, 12, 13, 14, 15, 16, 17, 18, 19, 20, 21, 22, 23, 24 and 25 are sectional views showing a method of manufacturing the display device according to the exemplary embodiments of the present inventive concept.

Referring to FIG. 9, the lower substrate 110 may include a transparent or opaque material. The lower substrate 110 may include a display area 10 and a peripheral area 20. The lower substrate 110 may be formed using a quartz substrate, a synthetic quartz substrate, a calcium fluoride substrate, a fluorine-doped quartz substrate, a sodalime glass substrate, a non-alkali glass substrate, or the like.

For example, the lower substrate 110 may be formed of a transparent resin substrate having flexibility. An example of the transparent resin substrate that can be used for the lower substrate 110 includes a polyimide substrate. In this case, the polyimide substrate may be composed of a first polyimide layer, a barrier film layer, a second polyimide layer, and the like. For example, the polyimide substrate may have a configuration in which a first polyimide layer, a barrier film layer and a second polyimide layer are sequentially laminated on a hard glass substrate. In the method of manufacturing the display device, after an insulating layer (such as a buffer layer) is formed on the second polyimide layer of the polyimide substrate, an upper structure (such as semiconductor elements and a sub-pixel structure) may be provided on the insulating layer. After the upper structure is provided, the hard glass substrate may be removed. In other words, because the polyimide substrate is thin and flexible, it may be difficult to directly provide the upper structure on the polyimide substrate. Considering the above difficulty, the polyimide substrate is disposed on the hard glass substrate and the upper structure is provided on the polyimide substrate disposed on the hard glass substrate. After the upper structure is formed on the hard glass substrate, the glass substrate is removed, so that the polyimide substrate may be used as the lower substrate 110.

A buffer layer (not shown) may be formed on the lower substrate 110. The buffer layer may be formed entirely on the lower substrate 110. The buffer layer may prevent metal atoms or impurities from diffusing from the lower substrate 110 to the semiconductor element and the sub-pixel structure, and may enable a substantially uniform active layer to be obtained by adjusting the rate of heat transfer during a crystallization process for forming the active layer. In addition, when the surface of the lower substrate 110 is not uniform, the buffer layer may serve to improve the flatness of the surface of the lower substrate 110. According to a type of substrate 110, at least two buffer layers may be provided on the substrate 110, or the buffer layer may not be formed thereon. For example, the buffer layer may be formed using an organic material or an inorganic material.

The first to third active layers 130_1, 130_2, and 130_3 may be formed. The first to third active layers 130_1, 130_2, and 130_3 may be disposed to be spaced apart from each other in the display area 10 on the lower substrate 110. Each of the first to third active layers 130_1, 130_2, and 130_3 may be formed using an oxide semiconductor, an inorganic semiconductor, an organic semiconductor, or the like, and may include a source area, a drain area and a channel area disposed between the source area and the drain area. In other words, the first to third active layers 130_1, 130_2, and 130_3 may be simultaneously formed using the same material.

The gate insulating layer 150 may be formed on the first to third active layers 130_1, 130_2, and 130_3. The gate insulating layer 150 may cover the first to third active layers 130_1, 130_2, and 130_3 in the display area 10 on the lower substrate 110, and may be formed entirely on the lower substrate 110. The gate insulating layer 150 may be formed in the peripheral area 20 on the lower substrate 110.

For example, the gate insulating layer 150 may sufficiently cover the first to third active layers 130_1, 130_2, and 130_3 on the lower substrate 110, and may have a substantially planarized top surface without generating a step around the first to third active layers 130_1, 130_2, and 130_3. However, the gate insulating layer 150 may be formed to have a uniform thickness along profiles of the first to third active layers 130_1, 130_2, and 130_3 while covering the first to third active layers 130_1, 130_2, and 130_3 on the lower substrate 110. The gate insulating layer 150 may be formed using silicon compound, metal oxide, or the like. For example, the gate insulating layer 150 may include silicon oxide, silicon nitride, silicon oxynitride, silicon oxycarbide, silicon carbonitride, aluminum oxide, aluminum nitride, tantalum oxide, hafnium oxide, zirconium oxide, titanium oxide, or the like. The gate insulating layer 150 may have a multi-layer structure including a plurality of insulating layers. For example, the insulating layers may have different thicknesses or include different materials.

The first to third gate electrodes 170_1, 170_2, and 170_3 may be formed to be spaced apart from each other on the gate insulating layer 150. For example, the first gate electrode 170_1 may be formed on a portion of the gate insulating layer 150 below which the first active layer 130_1 is located, the second gate electrode 170_2 may be formed on a portion of the gate insulating layer 150 below which the second active layer 130_2 is located, and the third gate electrode 170_3 may be disposed on a portion of the gate insulating layer 150 below which the third active layer 130_3 is located. Each of the first to third gate electrodes 170_1, 170_2, and 170_3 may be formed by using a metal, an alloy, a metal nitride, a conductive metal oxide, a transparent conductive material, or the like. For example, each of the first to third gate electrodes 170_1, 170_2, and 170_3 may include gold, silver, aluminum, platinum, nickel, titanium, palladium, magnesium, calcium, lithium, chromium, tantalum, tungsten, copper, molybdenum, scandium, neodymium, iridium, an alloy containing aluminum, aluminum nitride, an alloy containing silver, tungsten nitride, an alloy containing copper, an alloy containing molybdenum, titanium nitride, tantalum nitride, strontium ruthenium oxide, zinc oxide, indium tin oxide, tin oxide, indium oxide, gallium oxide, indium zinc oxide, or the like. These may be used alone or in combination with each other. In other words, the first to third gate electrodes 170_1, 170_2, and 170_3 may be simultaneously formed using the same material. Each of the first to third gate electrodes 170_1, 170_2, and 170_3 may have a multi-layer structure including a plurality of layers.

The interlayer insulating layer 190 may be formed on the first to third gate electrodes 170_1, 170_2, and 170_3. The interlayer insulating layer 190 may cover the first to third gate electrodes 170_1, 170_2, and 170_3 in the display area 10 on the gate insulating layer 150, and may be formed entirely on the gate insulating layer 150. Selectively, the interlayer insulating layer 190 may be formed in the peripheral area 20 on the lower substrate 110.

For example, the interlayer insulating layer 190 may sufficiently cover the first to third gate electrodes 170_1, 170_2, and 170_3 on the gate insulating layer 150, and may have a substantially planarized top surface without generating a step around the first to third gate electrodes 170_1, 170_2, and 170_3. However, the interlayer insulating layer 190 may be formed to have a uniform thickness along profiles of the first to third gate electrodes 170_1, 170_2, and 170_3 while covering the first to third gate electrodes 170_1, 170_2, and 170_3 on the gate insulating layer 150. The interlayer insulating layer 190 may be formed by using silicon compound, metal oxide, or the like. Selectively, the interlayer insulating layer 190 may have a multi-layer structure including a plurality of insulating layers. For example, the insulating layers may have different thicknesses or include different materials.

A first source electrode 210_1, a first drain electrode 230_1, a second source electrode 210_2, a second drain electrode 230_2, a third source electrode 210_3, and a third drain electrode 230_3 may be formed to be spaced apart from each other in the display area 10 on the interlayer insulating layer 190. For example, the first source electrode 210_1 may be connected to a source area of the first active layer 130_1 through a contact hole formed by removing first portions of the gate insulating layer 150 and the interlayer insulating layer 190, and the first drain electrode 230_1 may be connected to a drain area of the first active layer 130_1 through a contact hole formed by removing second portions of the gate insulating layer 150 and the interlayer insulating layer 190. In addition, the second source electrode 210_2 may be connected to a source area of the second active layer 130_2 through a contact hole formed by removing third portions of the gate insulating layer 150 and the interlayer insulating layer 190, and the second drain electrode 230_2 may be connected to a drain area of the second active layer 130_2 through a contact hole formed by removing fourth portions of the gate insulating layer 150 and the interlayer insulating layer 190. In addition, the third source electrode 210_3 may be connected to a source area of the third active layer 130_3 through a contact hole formed by removing fifth portions of the gate insulating layer 150 and the interlayer insulating layer 190, and the third drain electrode 230_3 may be connected to a drain area of the third active layer 130_3 through a contact hole formed by removing sixth portions of the gate insulating layer 150 and the interlayer insulating layer 190. The first to third source electrodes 210_1, 210_2, and 210_3 and the first to third drain electrodes 230_1, 230_2, and 230_3 may be formed using a metal, an alloy, a metal nitride, a conductive metal oxide, a transparent conductive material, or the like. These may be used alone or in combination with each other. The first to third source electrodes 210_1, 210_2, and 210_3 and the first to third drain electrodes 230_1, 230_2, and 230_3 may be simultaneously formed using the same material. The first to third source electrodes 210_1, 210_2, and 210_3 and the first to third drain electrodes 230_1, 230_2, and 230_3 may have a multi-layer structure including a plurality of layers.

Accordingly, the first semiconductor element 250_1 including the first active layer 130_1, the first gate electrode 170_1, the first source electrode 210_1 and the first drain electrode 230_1 may be disposed, the second semiconductor element 250_2 including the second active layer 130_2, the second gate electrode 170_2, the second source electrode 210_2 and the second drain electrode 230_2 may be disposed, and the third semiconductor element 250_3 including the third active layer 130_3, the third gate electrode 170_3, the third source electrode 210_3 and the third drain electrode 230_3 may be disposed.

Figure 10:
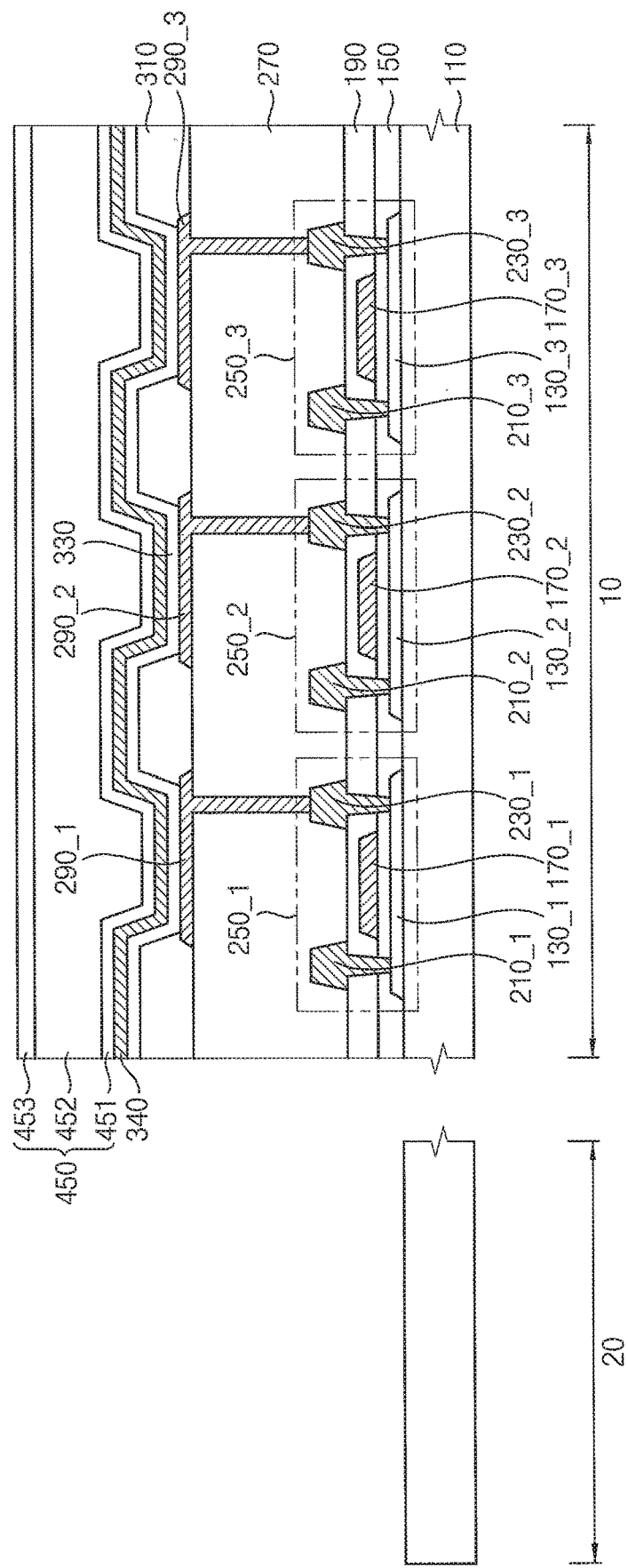

Referring to FIG. 10, the planarization layer 270 may be formed in the display area 10 on the interlayer insulating layer 190 and the first to third semiconductor elements 250_1, 250_2 and 250_3, and may not be formed in the peripheral area 20. For example, the planarization layer 270 may have a thickness thick enough to sufficiently cover the first to third source electrodes 210_1, 210_2 and 210_3 and the first to third drain electrodes 230_1, 230_2 and 230_3 on the interlayer insulating layer 190. In this case, the planarization layer 270 may have a substantially planarized top surface. When the planarization layer 270 has an uneven surface, a planarization process may be further performed to the planarization layer 270 to implement the above planarized top surface of the planarization layer 270. The planarization layer 270 may be formed using an organic material.

The first to third lower electrodes 290_1, 290_2, and 290_3 may be formed to be spaced apart from each other in the display area 10 on the planarization layer 270 after forming contact holes to expose the first to third drain electrodes 230_1, 230_2, and 230_3. When forming the contact holes, the planarization layer 270 in the peripheral area 20 may also be removed. The first to third lower electrodes 290_1, 290_2, and 290_3 may be connected to the first to third drain electrodes 230_1, 230_2, and 230_3 through contact holes formed in the planarization layer 270, respectively. In other words, the first to third lower electrodes 290_1, 290_2, and 290_3 may be electrically connected to the first to third semiconductor elements 250_1, 250_2, and 250_3, respectively. The first to third lower electrodes 290_1, 290_2, and 290_3 may be formed by using a metal, an alloy, a metal nitride, a conductive metal oxide, a transparent conductive material, or the like. These may be used alone or in combination with each other. In other words, the first to third lower electrodes 290_1, 290_2, and 290_3 may be simultaneously formed using the same material. The first to third lower electrodes 290_1, 290_2, and 290_3 may have a multi-layer structure including a plurality of layers.

The pixel defining layer 310 may be formed in the display area 10 on parts of the first to third lower electrodes 290_1, 290_2, and 290_3 and on the planarization layer 270. The pixel defining layer 310 may be patterned to cover both sides of each of the first to third lower electrodes 290_1, 290_2, and 290_3, and expose a part of an upper surface of each of the first to third lower electrodes 290_1, 290_2, and 290_3. The pixel defining layer 310 in the peripheral area 20 may also be removed when patterning the pixel defining layer 310. The pixel defining layer 310 may be formed using an organic material.

The light emitting layer 330 may be formed in the display area 10 on the first to third lower electrodes 290_1, 290_2, and 290_3 exposed by the pixel defining layer 310. In other words, the light emitting layer 330 may be continuously (or integrally) formed in the display area 10 on the lower substrate 110. In exemplary embodiments, the light emitting layer 330 may be formed using a light emitting material capable of emitting blue light. On the contrary, the light emitting layer 330 may be formed by laminating a plurality of light emitting materials capable of generating other color light such as red light, green light, and blue light, so that white light may be emitted as a whole.

The upper electrode 340 may be formed in the display area 10 on the pixel defining layer 310 and the light emitting layer 330. The upper electrode 340 may be formed by using a metal, an alloy, a metal nitride, a conductive metal oxide, a transparent conductive material, or the like. These may be used alone or in combination with each other. Selectively, the upper electrode 340 may have a multi-layer structure including a plurality of layers.

Accordingly, the first sub-pixel structure including the first lower electrode 290_1, the light emitting layer 330, and the upper electrode 340 may be disposed, the second sub-pixel structure including the second lower electrode 290_2, the light emitting layer 330, and the upper electrode 340 may be disposed, and the third sub-pixel structure including the third lower electrode 290_3, the light emitting layer 330, and the upper electrode 340 may be disposed.

The first thin film encapsulation layer 451 may be formed on the upper electrode 340. The first thin film encapsulation layer 451 may be formed to have a uniform thickness along the profile of the upper electrode 340 while covering the upper electrode 340. The first thin film encapsulation layer 451 may be formed in the peripheral area 20 on the lower substrate 110. The first thin film encapsulation layer 451 may prevent the first to third sub-pixel structures from deteriorating due to the permeation of the moisture, oxygen, or the like. In addition, the first thin film encapsulation layer 451 may also function to protect the first to third sub-pixel structures from an external impact. The first thin film encapsulation layer 451 may be formed using flexible inorganic materials.

The second thin film encapsulation layer 452 may be formed on the first thin film encapsulation layer 451. The second thin film encapsulation layer 452 may improve the flatness of the display device 100, and may protect the first to third sub-pixel structures. The second thin film encapsulation layer 452 may include flexible organic materials.

The third thin film encapsulation layer 453 may be formed on the second thin film encapsulation layer 452. The third thin film encapsulation layer 453 may be formed to have a uniform thickness along the profile of the second thin film encapsulation layer 452 while covering the second thin film encapsulation layer 452. The third thin film encapsulation layer 453 may be formed in the peripheral area 20 on the lower substrate 110. The third thin film encapsulation layer 453 together with the first thin film encapsulation layer 451 may prevent the first to third sub-pixel structures from deteriorating due to the permeation of the moisture, oxygen, or the like. In addition, the third thin film encapsulation layer 453, together with the first thin film encapsulation layer 451 and the second thin film encapsulation layer 452, may also function to protect the first to third sub-pixel structures from the external impact. The third thin film encapsulation layer 453 may be formed using flexible inorganic materials.

Accordingly, the thin film encapsulation structure 450 including the first thin film encapsulation layer 451, the second thin film encapsulation layer 452, and the third thin film encapsulation layer 453 may be formed. The thin film encapsulation structure 450 may be a five-layer structure formed by laminating first to fifth thin film encapsulation layers or a seven-layer structure formed by laminating first to seventh thin film encapsulation layers.

Figure 11:
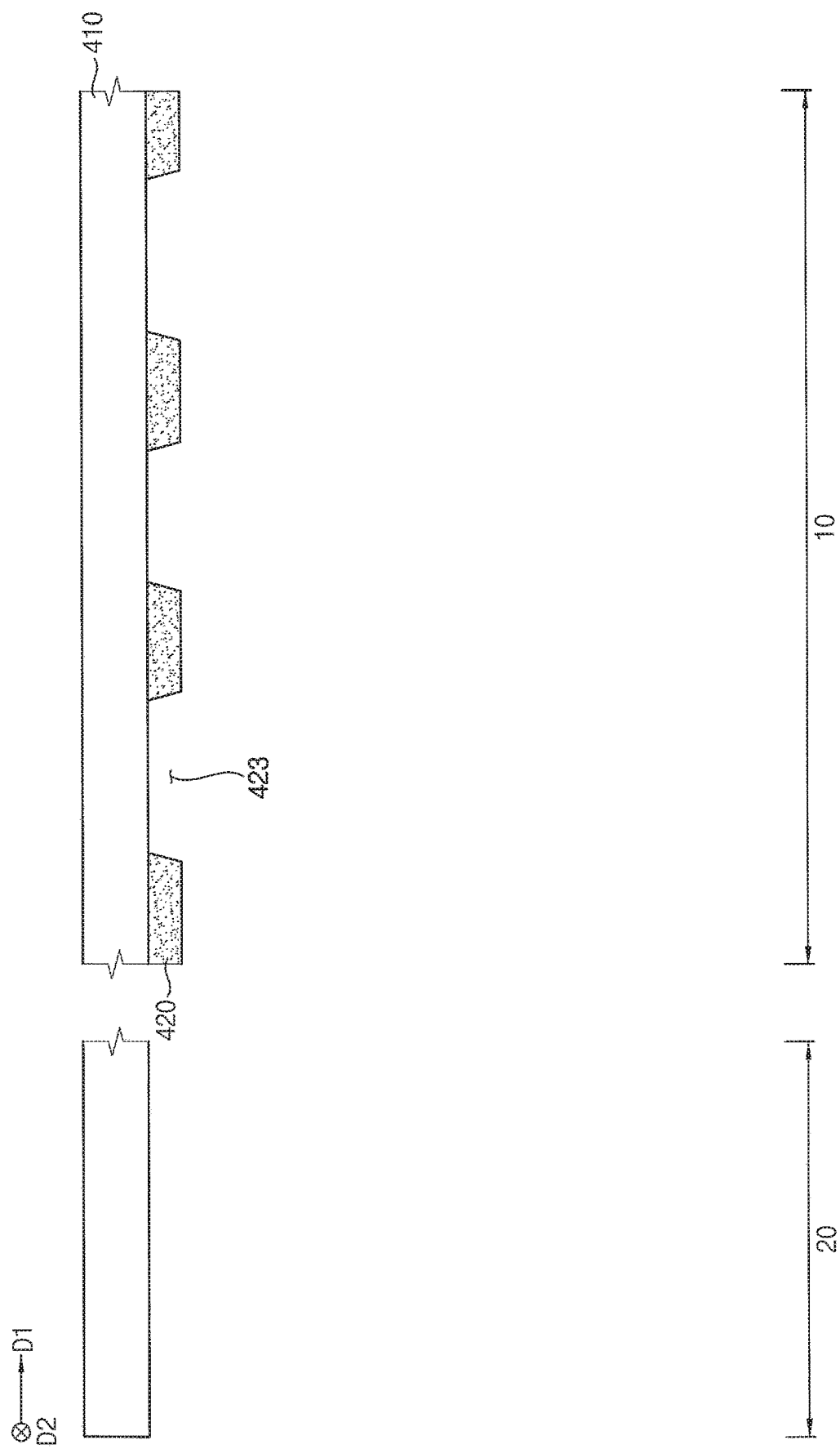
Figure 12:
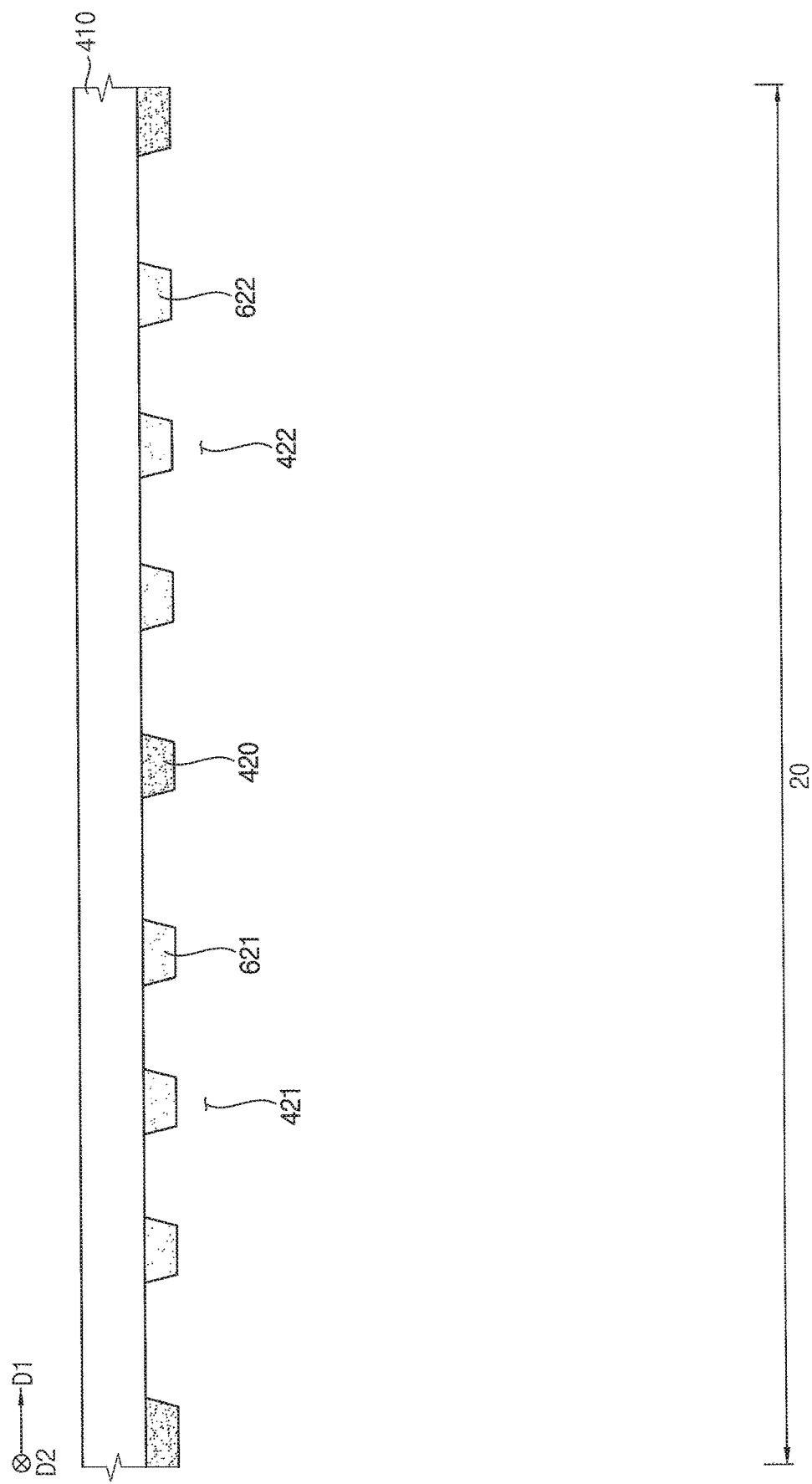

Referring to FIGS. 11 and 12, the upper substrate 410 may be provided. The upper substrate 410 and the lower substrate 110 may include substantially the same material. For example, the upper substrate 410 may be formed using a quartz substrate, a synthetic quartz substrate, a calcium fluoride substrate, a fluorine-doped quartz substrate, a sodalime glass substrate, a non-alkali glass substrate, or the like.

The light shielding pattern 420 may be formed in parts of the display area 10 and the peripheral area 20 on the bottom surface of the upper substrate 410. The light shielding pattern 420 may have the third openings 423 in the display area 10, and may have the first opening 421 and the second opening 422 in the peripheral area 20. The shielding pattern 420 may be formed using an organic material such as photoresist, polyacryl-based resin, polyimide-based resin, polyamide-based resin, siloxane-based resin, acryl-based resin, or epoxy-based resin. In addition, the light shielding pattern 420 may be substantially opaque. For example, the light shielding pattern 420 may further include a light shielding material to absorb light. The light shielding material may be formed using carbon black, titanium nitride oxide, titanium black, phenylene black, aniline black, cyanine black, nigrosine acid black, black resin, or the like.

The first reference alignment patterns 621 may be formed in the first opening 421 of the light shielding pattern 420 on the bottom surface of the upper substrate 410, and the second reference alignment patterns 622 may be formed in the second opening 422 of the light shielding pattern 420 on the bottom surface of the upper substrate 410. For example, the first reference alignment patterns 621 having a black color may be spaced apart from each other in the first opening 421, and the second reference alignment patterns 622 having a black color may be spaced apart from each other in the second opening 422. In other words, the light shielding pattern 420, the first reference alignment patterns 621, and the second reference alignment patterns 622 may be simultaneously formed using the same material. The widths of the first and second reference alignment patterns 621 and 622 may be substantially the same as the width of the light shielding pattern 420 disposed between two adjacent third openings 423.

Figure 13:
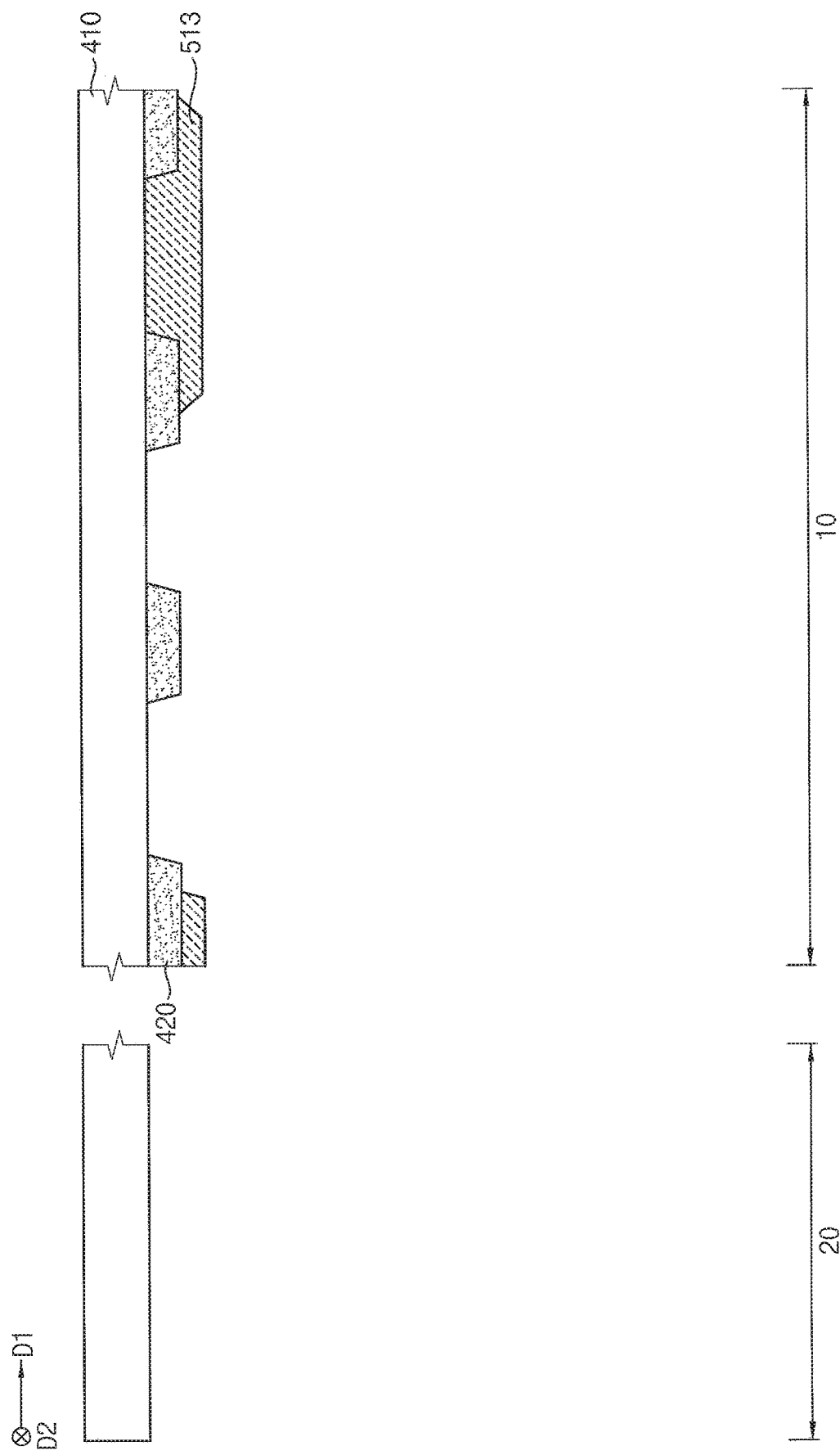
Figure 14:
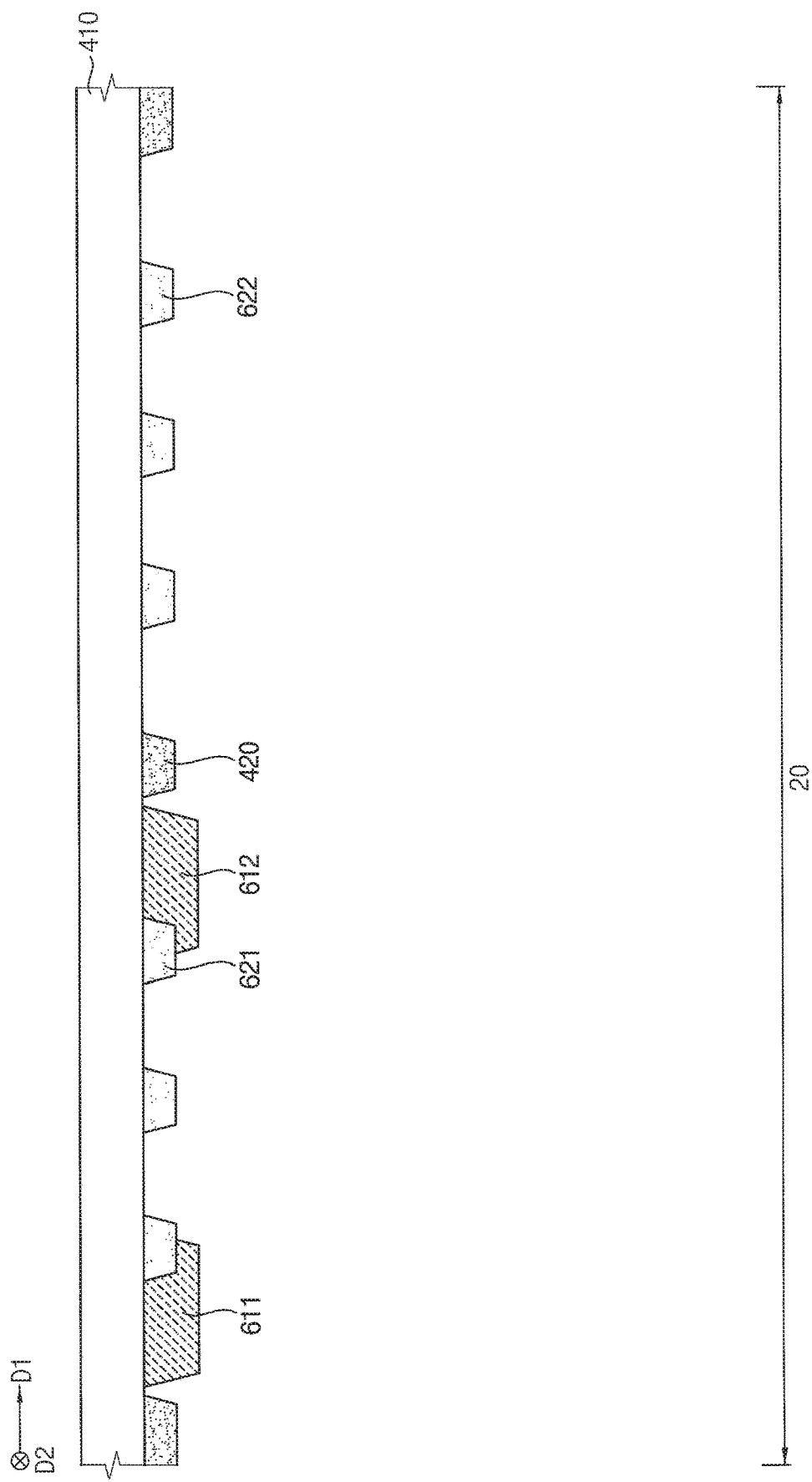

Referring to FIGS. 13 and 14, the third color filter pattern 513 for transmitting red light may be formed onto the bottom surface of the upper substrate 410 in the third opening 423 located at the right side of the third openings 423 as shown in FIG. 13. As described above, the third color filter pattern 513 may be repeatedly formed on the bottom surface of the upper substrate 410. Accordingly, a part of the third color filter pattern formed at the left side of the third color filter pattern 513 may be shown at the left side of the light shielding pattern 420. The third color filter pattern 513 may overlap a part of the bottom surface of the light shielding pattern 420 adjacent to both sides of the third opening 423 located at the right side, and may have the first width along the first direction D1. In other words, the third color filter pattern 513 may be partially formed on the bottom surface of the shielding pattern 420 to fill the third opening 423 located at the right side. The third color filter pattern 513 may be formed using photosensitive resin or color photoresist.

The first color filter alignment pattern 611 and the fourth color filter alignment pattern 612, which have a red color, may be formed to be spaced apart from each other in the first opening 421 on the bottom surface of the upper substrate 410 along the first direction D1. For example, the first color filter alignment pattern 611 having the first width may be formed to partially overlap the left first reference alignment pattern 621 located at the left side of the first reference alignment patterns 621. In other words, one side of the first color filter alignment pattern 611 may overlap the left first reference alignment pattern 621 located at the left side. The fourth color filter alignment pattern 612 having the first width may be formed to partially overlap the right first reference alignment pattern 621 located at the right side of the first reference alignment patterns 621. In other words, one side of the fourth color filter alignment pattern 612 may overlap the right first reference alignment pattern 621 located at the right side. In exemplary embodiments, a shape of the third color filter pattern 513 may be the same as a shape of the fourth color filter alignment pattern 512, and a partial shape of the third color filter pattern formed at the left side of the third color filter pattern 513 may be the same as a partial shape of the first color filter alignment pattern 611. In addition, the third color filter pattern 513, the first color filter alignment pattern 611, and the fourth color filter alignment pattern 612 may be simultaneously formed using the same material. Further, the first width of the third color filter pattern 513 along the first direction D1 may be substantially the same as the first widths W1 of the first and fourth color filter alignment patterns 611 and 612 along the first direction D1.

Figure 15:
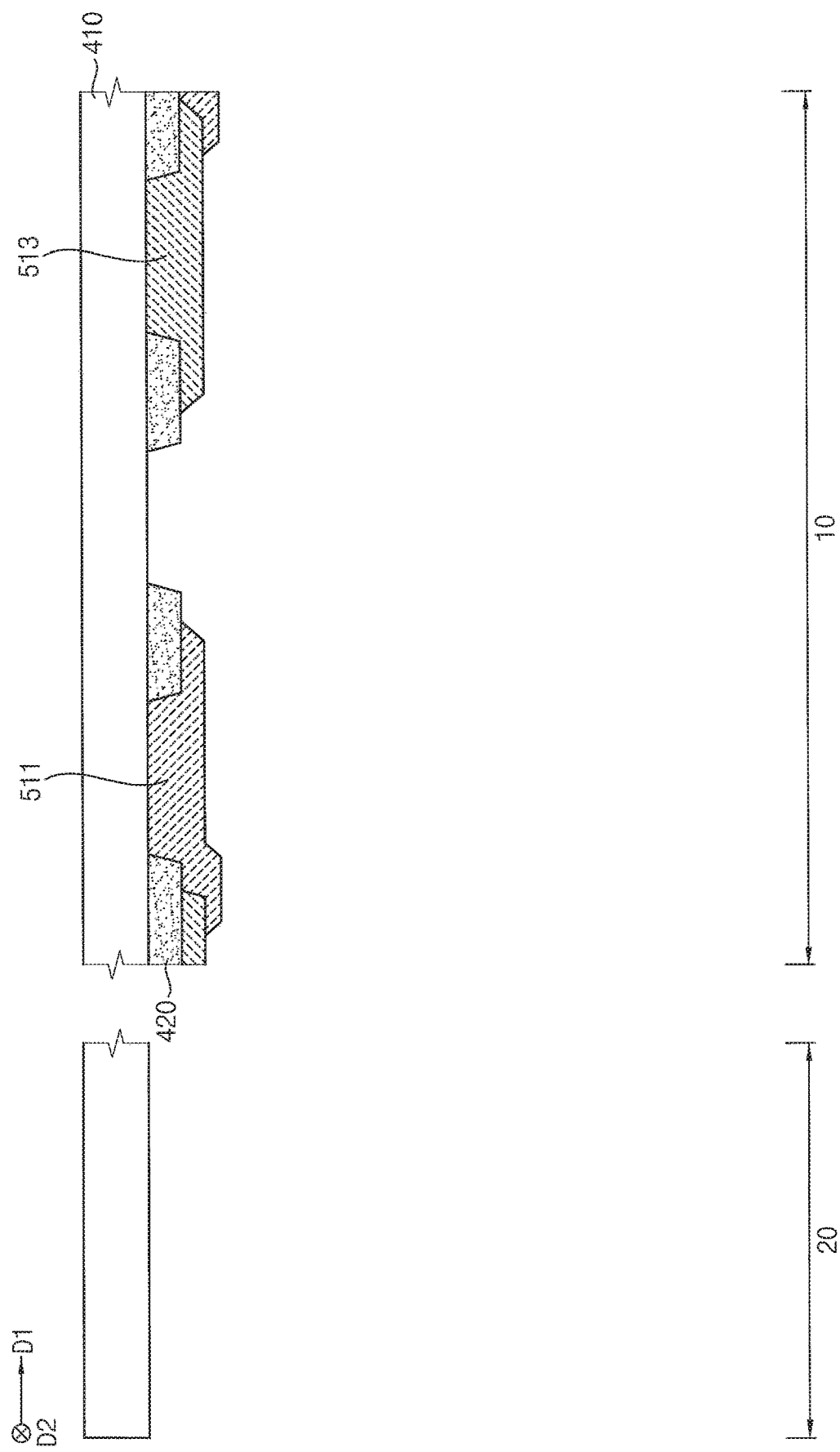
Figure 16:
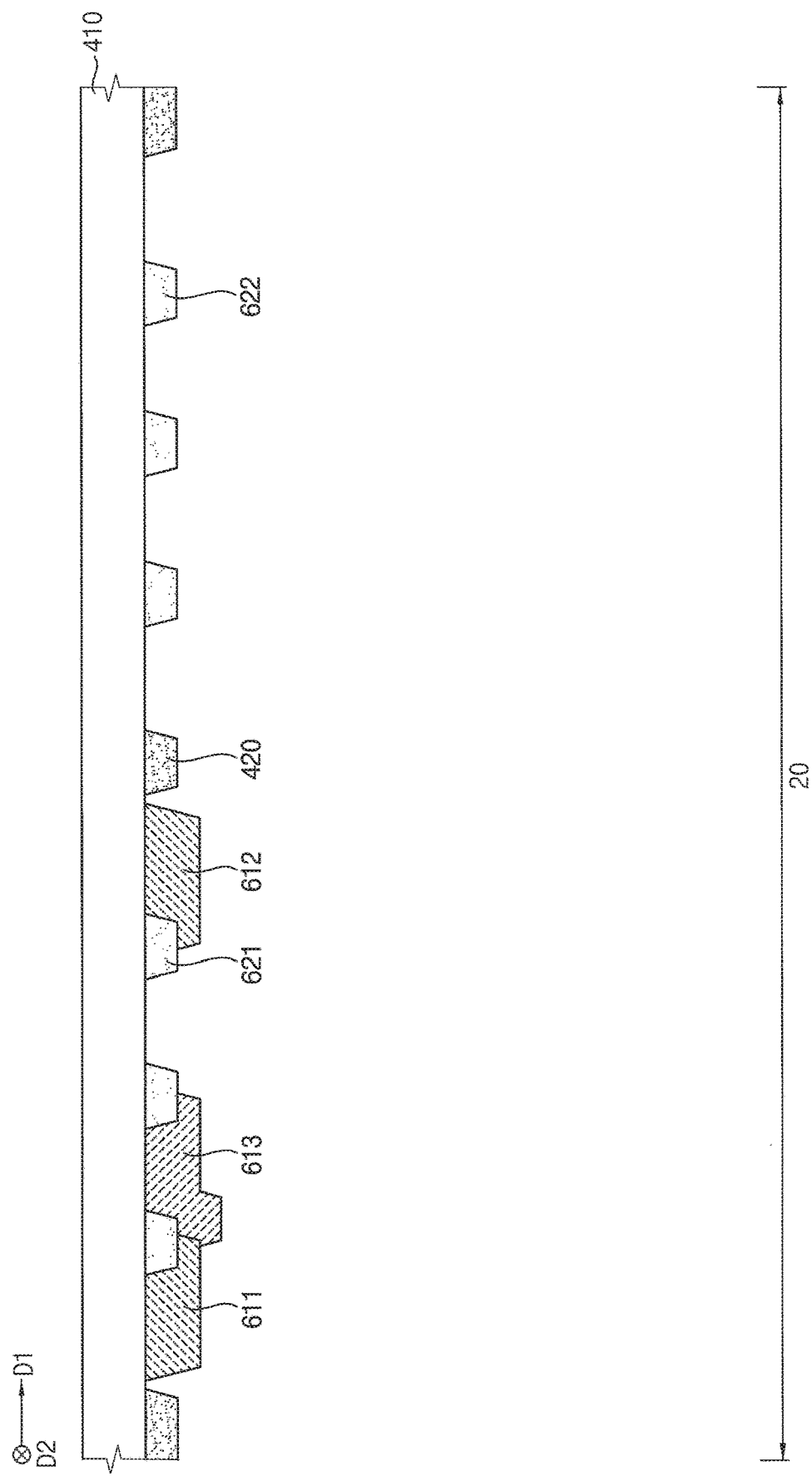

Referring to FIGS. 15 and 16, the first color filter pattern 511 for transmitting green light may be formed onto the bottom surface of the upper substrate 410 in the third opening 423 located at the left side of the third openings 423 as shown in FIG. 15. As described above, the first color filter pattern 511 may be repeatedly formed on the bottom surface of the upper substrate 410. Accordingly, a part of the first color filter pattern formed at the right side of the first color filter pattern 511 may be shown at the right side of the light shielding pattern 420.

The first color filter pattern 511 may overlap a part of the bottom surface of the light shielding pattern 420 adjacent to both sides of the third opening 423 located at the left side, and may have the first width along the first direction D1. In other words, the first color filter pattern 511 may be partially formed on the bottom surface of the light shielding pattern 420 adjacent to the both sides of the third opening 423 located at the left side while filling the third opening 423 located at the left side. The first color filter pattern 511 may be formed using photosensitive resin or color photoresist.

The second color filter alignment pattern 613 having a green color may be formed on the bottom surface of the upper substrate 410 so as to be adjacent to the first color filter alignment pattern 611. For example, the second color filter alignment pattern 613 having the first width W1 along a first direction D1 may be formed between the center first reference alignment pattern 621 located at the center of the first reference alignment patterns 621 and the left first reference alignment pattern 621 located at the left side of the first reference alignment patterns 621, and may partially overlap the left first reference alignment pattern 621 located at the left side and the center first reference alignment pattern 621 located at the center. In addition, the second color filter alignment pattern 613 may overlap the one side of the first color filter alignment pattern 611 on the left first reference alignment pattern 621 located at the left side, such that one side of the second color filter alignment pattern 613 is formed on the one side of the first color filter alignment pattern 611. In exemplary embodiments, a shape of the first color filter pattern 511 may be the same as a shape of the second color filter alignment pattern 613. In addition, the first color filter pattern 511 and the second color filter alignment pattern 613 may be simultaneously formed using the same material. Further, the first width of the first color filter pattern 511 may be substantially the same as the first width W1 of the second color filter alignment pattern 613 along a first direction D1.

Figure 17:
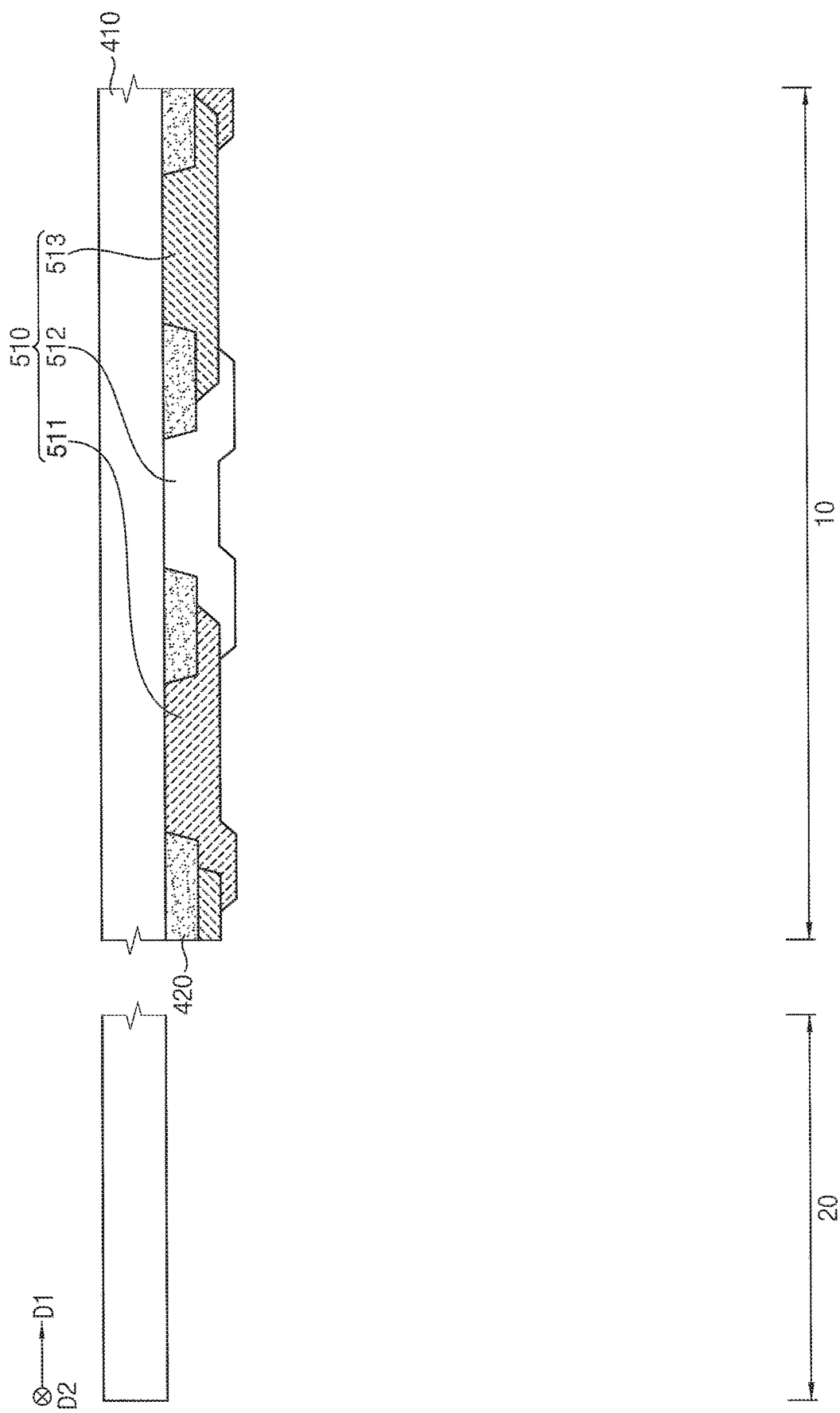
Figure 18:
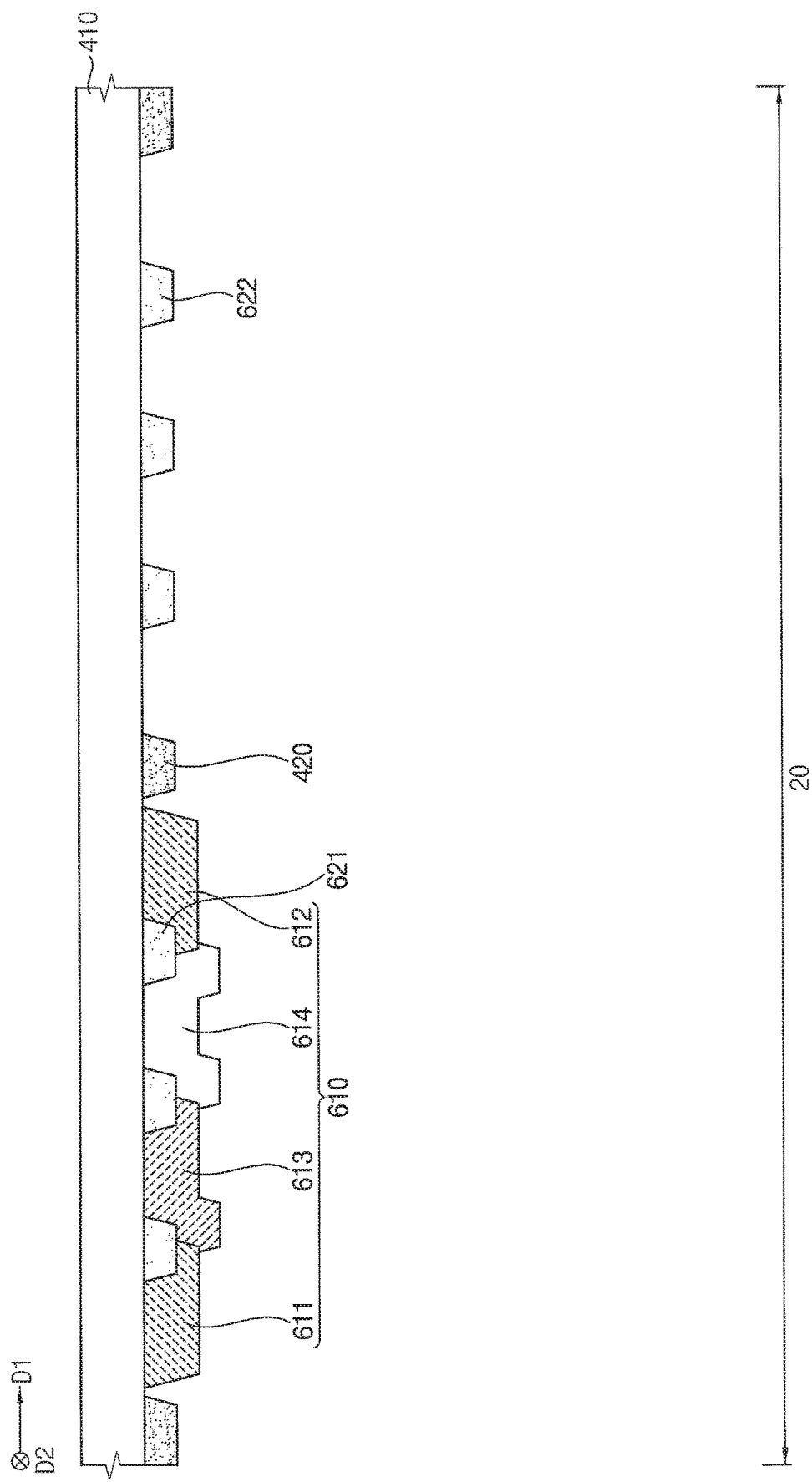

Referring to FIGS. 17 and 18, the second color filter pattern 512 for transmitting blue light may be formed onto the bottom surface of the upper substrate 410 in the third opening 423 located at the center of the third openings 423 as shown in FIG. 13. As described above, the second color filter pattern 512 may be repeatedly formed on the bottom surface of the upper substrate 410. The second color filter pattern 512 may simultaneously overlap parts of the first color filter pattern 511 and the third color filter pattern 513, and may have the first width along the first direction D1. In other words, the second color filter pattern 512 may be partially formed on the bottom surface of the first color filter pattern 511 and the bottom surface of the third color filter pattern 513 while filling the third opening 423 located at the center. The second color filter pattern 512 may be formed using photosensitive resin or color photoresist.

Accordingly, the color filter layer 510 including the first color filter pattern 511, the second color filter pattern 512, and the third color filter pattern 513 may be formed.

The third color filter alignment pattern 614 emitting a blue color light may be formed on the bottom surface of the upper substrate 410 between the center first reference alignment pattern 621 located at the center and the right first reference alignment pattern 621 located at the right side, and may partially overlap the center first reference alignment pattern 621 located at the center and the right first reference alignment pattern 621 located at the right side. In other words, the third color filter alignment pattern 614 may be formed between the second color filter alignment pattern 613 and the fourth color filter alignment pattern 612. In addition, the third color filter alignment pattern 614 may overlap the other side of the second color filter alignment pattern 613 on the center first reference alignment pattern 621 located at the center, such that one side of the third color filter alignment pattern 614 is formed on the other side of the second color filter alignment pattern 613. Further, the other side of the third color filter alignment pattern 614 may overlap the one side of the fourth color filter alignment pattern 612 on the right first reference alignment pattern 621 located at the right side, such that the other side of the third color filter alignment pattern 614 is formed on the one side of the fourth color filter alignment pattern 612. In exemplary embodiments, a shape of the second color filter pattern 512 may be the same as a shape of the third color filter alignment pattern 614. In addition, the second color filter pattern 512 and the third color filter alignment pattern 614 may be simultaneously formed using the same material. Further, the first width of the second color filter pattern 512 along a first direction D1 may be substantially the same as the first width W1 of the third color filter alignment pattern 614 along a first direction D1.

Accordingly, the color filter alignment patterns 610 including the first color filter alignment pattern 611, the fourth color filter alignment pattern 612, the second color filter alignment pattern 613, and the third color filter alignment pattern 614 may be formed.

Figure 19:
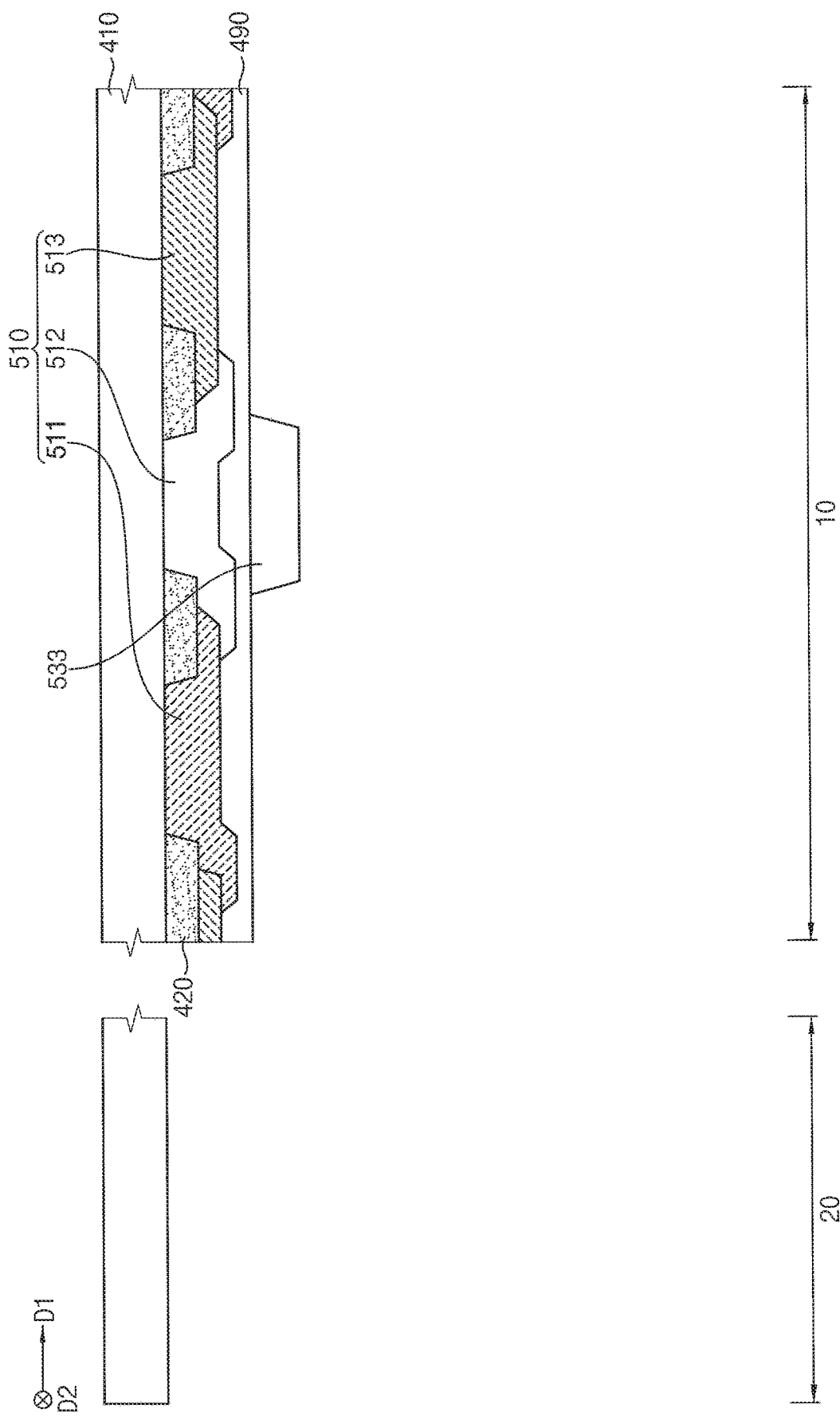
Figure 20:
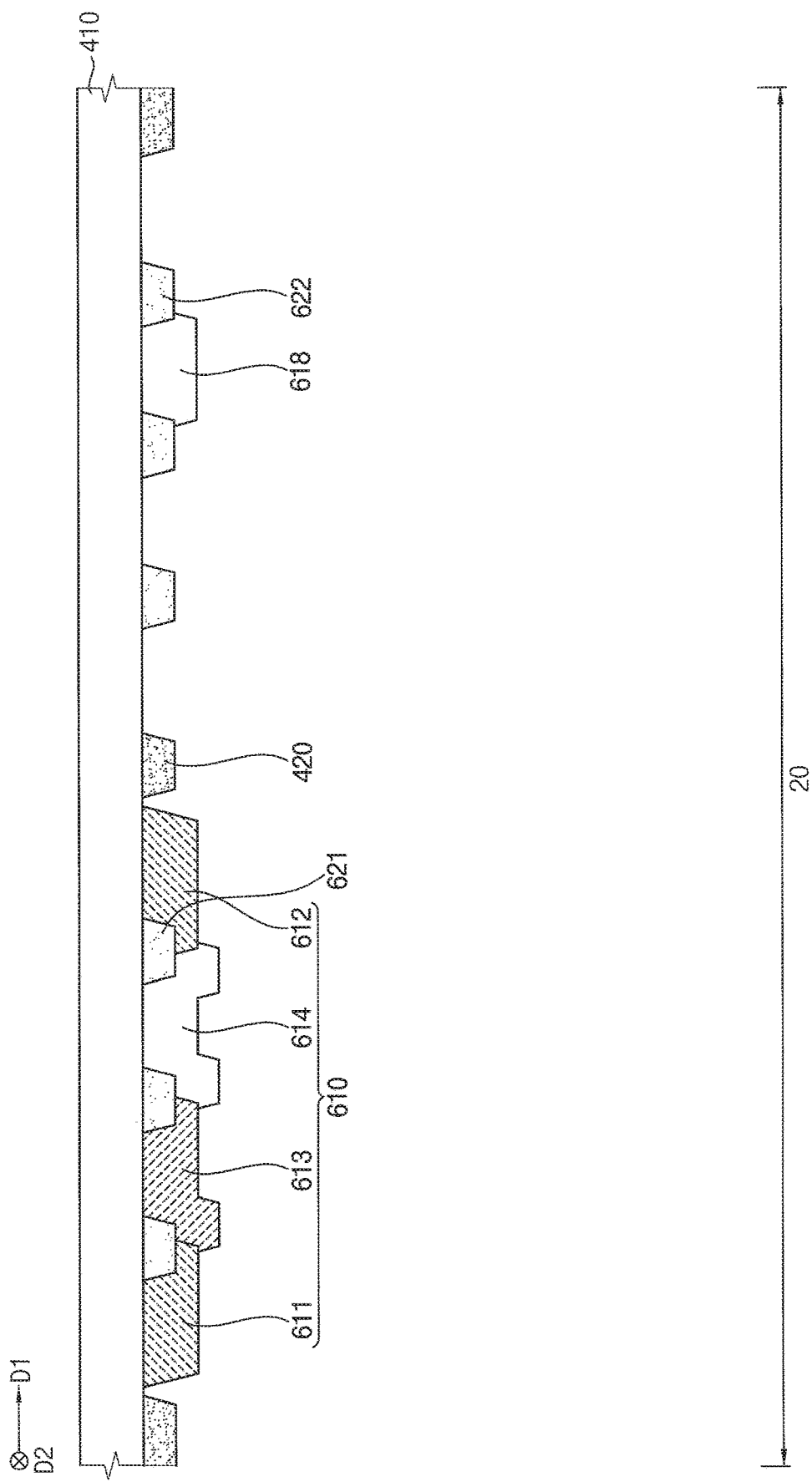

Referring to FIGS. 19 and 20, the first protective layer 490 may be formed in the display area 10 on the bottom surface of the upper substrate 410 to cover the light shielding pattern 420 and the color filter layer 510, and may not be formed in the peripheral area 20. For example, the first protective layer 490 may be formed relatively thickly to sufficiently cover the light shielding pattern 420 and the color filter layer 510 on the bottom surface of the upper substrate 410. The first protective layer 490 may be formed using an organic material.

The scattering pattern 533 having a second width smaller than the first width may be formed on the bottom surface of the first protective layer 490 while overlapping the second color filter pattern 512 having the first width in a plan view. The scattering pattern 533 may transmit blue light. The scattering pattern 533 may be formed using TiO, ZrO, AlO3, In2O3, ZnO, SnO2, Sb2O3, ITO, or the like.

The third optical filter alignment pattern 618 having a blue color may be formed in the second opening 422 on the bottom surface of the upper substrate 410. For example, the third color filter alignment pattern 618 having the second width W2 along a first direction D1 may be formed between the center second reference alignment pattern 622 located at the center of the second reference alignment patterns 622 and the right second reference alignment pattern 622 located at the right side of the second reference alignment patterns 622, and may partially overlap the center second reference alignment pattern 622 located at the center and the right second reference alignment pattern 622 located at the right side. In exemplary embodiments, a shape of the third optical filter alignment pattern 618 may be the same as a shape of the scattering pattern 533, and the third optical filter alignment pattern 618 and the scattering pattern 533 may be simultaneously formed using the same material. In addition, the second width of the scattering pattern 533 along a first direction D1 may be substantially the same as the second width W2 of the third optical filter alignment pattern 618 along a first direction D1.

Figure 21:
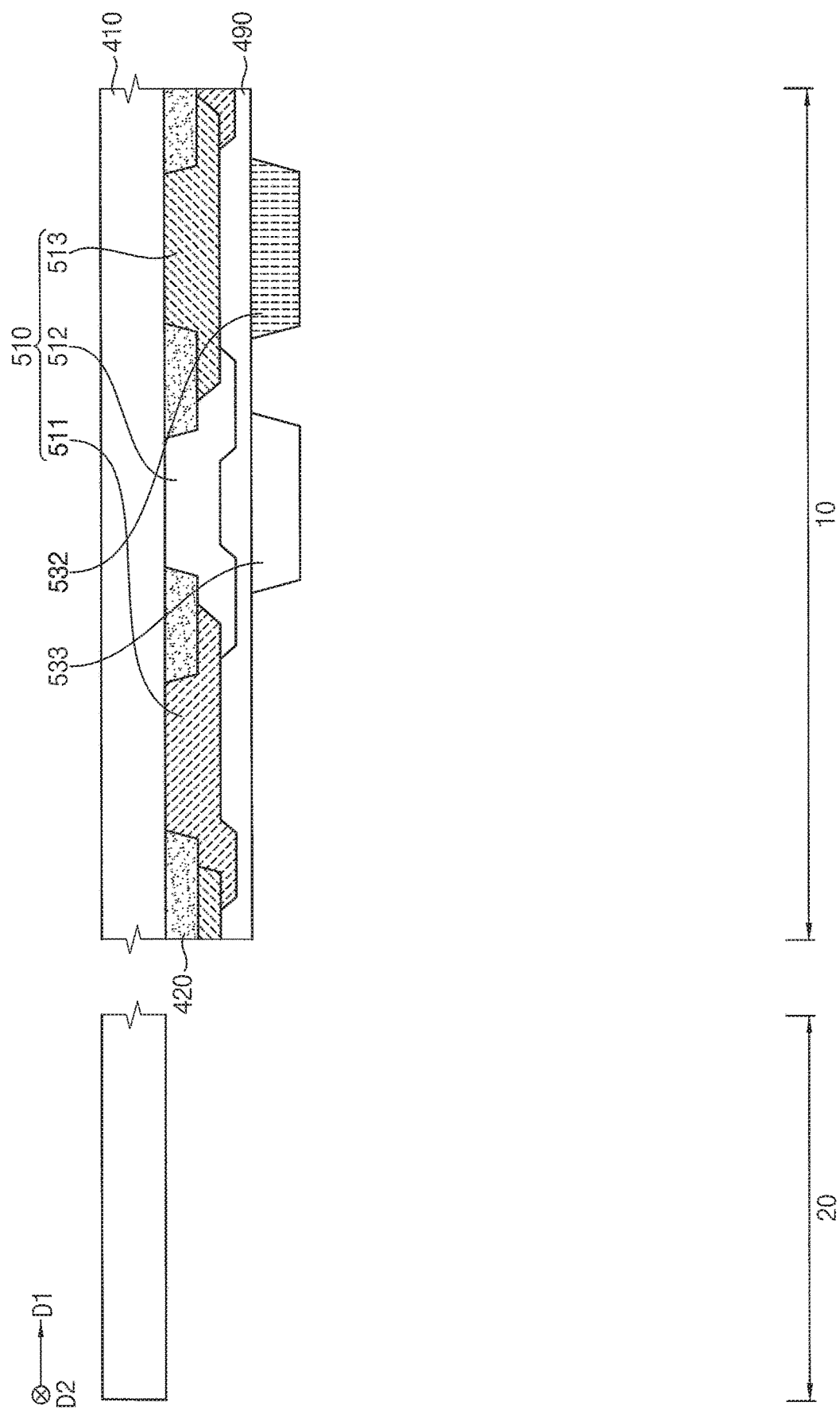
Figure 22:
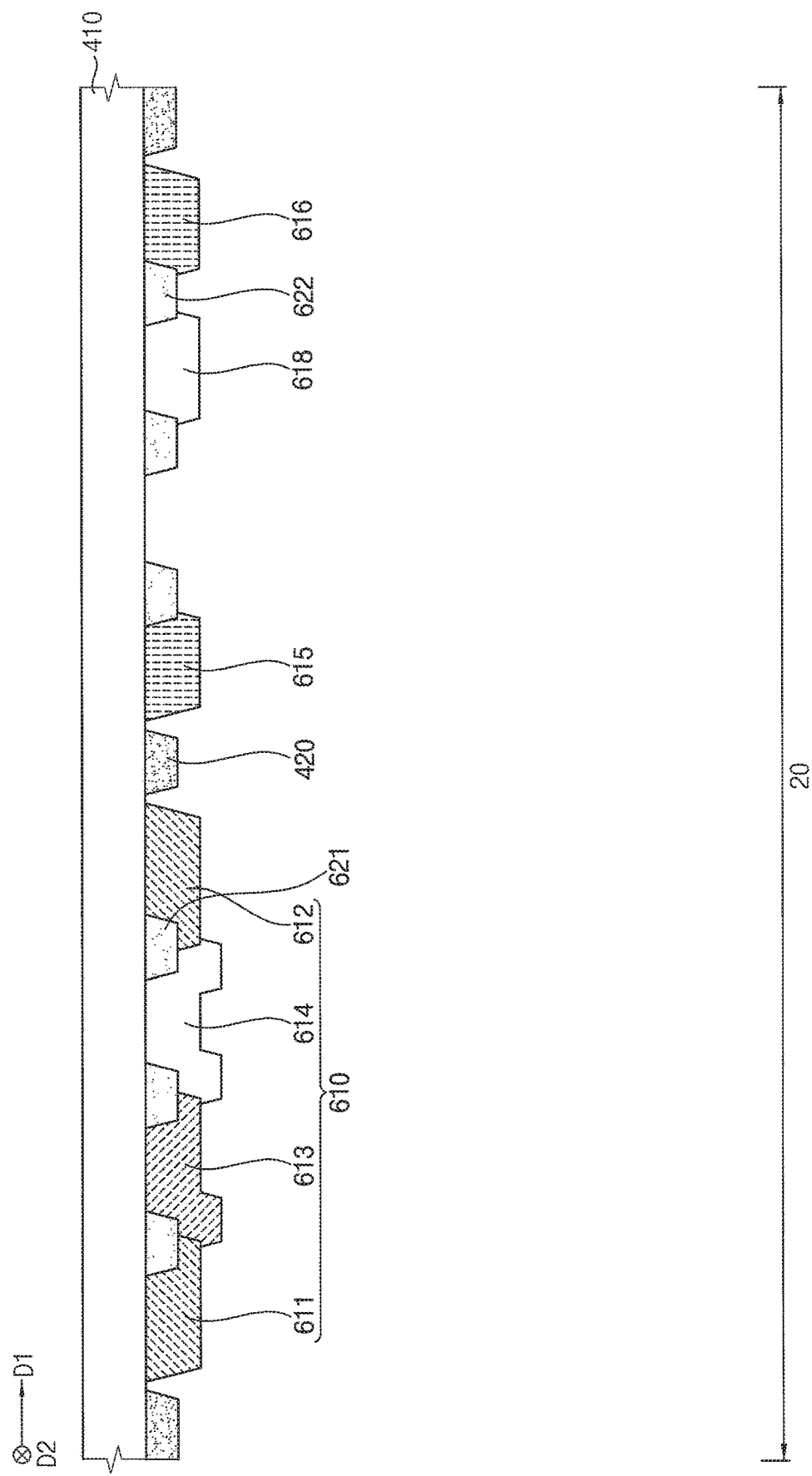

Referring to FIGS. 21 and 22, the second quantum dot pattern 532 having the second width along a first direction D1 may be formed on the bottom surface of the first protective layer 490 while overlapping the third color filter pattern 513 having the first width along a first direction D1. In other words, the second quantum dot pattern 532 may be spaced apart from the scattering pattern 533. The second quantum dot pattern 532 may convert blue light into red light. The second quantum dot pattern 532 may include a plurality of quantum dots. The quantum dots included in the second quantum dot pattern 532 may be formed using any one among silicon-based nanocrystal, II-VI group-based compound semiconductor nanocrystal, III-V group-based compound semiconductor nanocrystal, IV-VI group-based compound semiconductor nanocrystal, or a mixture thereof.

The first optical filter alignment pattern 615 and the fourth optical filter alignment pattern 616, which emit a red color, may be spaced apart from each other in the second opening 422 on the bottom surface of the upper substrate 410. For example, the first optical filter alignment pattern 615 having the second width along a first direction D1 may be formed to partially overlap the left second reference alignment pattern 622 located at the left side of the second reference alignment patterns 622. In other words, one side of the first optical filter alignment pattern 615 may overlap the left second reference alignment patterns 622 located at the left side. In addition, the fourth optical filter alignment pattern 616 may be formed to partially overlap the right second reference alignment pattern 622 located at the right side. In other words, one side of the fourth optical filter alignment pattern 616 may overlap the right second reference alignment pattern 622 located at the right side. The one side of the fourth optical filter alignment pattern 616 and the one side of the third optical filter alignment pattern 618 may be spaced apart from each other on the right second reference alignment pattern 622 located at the right side. In exemplary embodiments, a shape of the fourth optical filter alignment pattern 616 may be the same as a shape of the second quantum dot pattern 532, and the fourth optical filter alignment pattern 616 and the second quantum dot pattern 532 may be simultaneously formed using the same material. In addition, the second width of the second quantum dot pattern 532 along a first direction D1 may be the same as the second widths W2 of the first optical filter alignment pattern 615 and the fourth optical filter alignment pattern 616 along a first direction D1.

Figure 23:
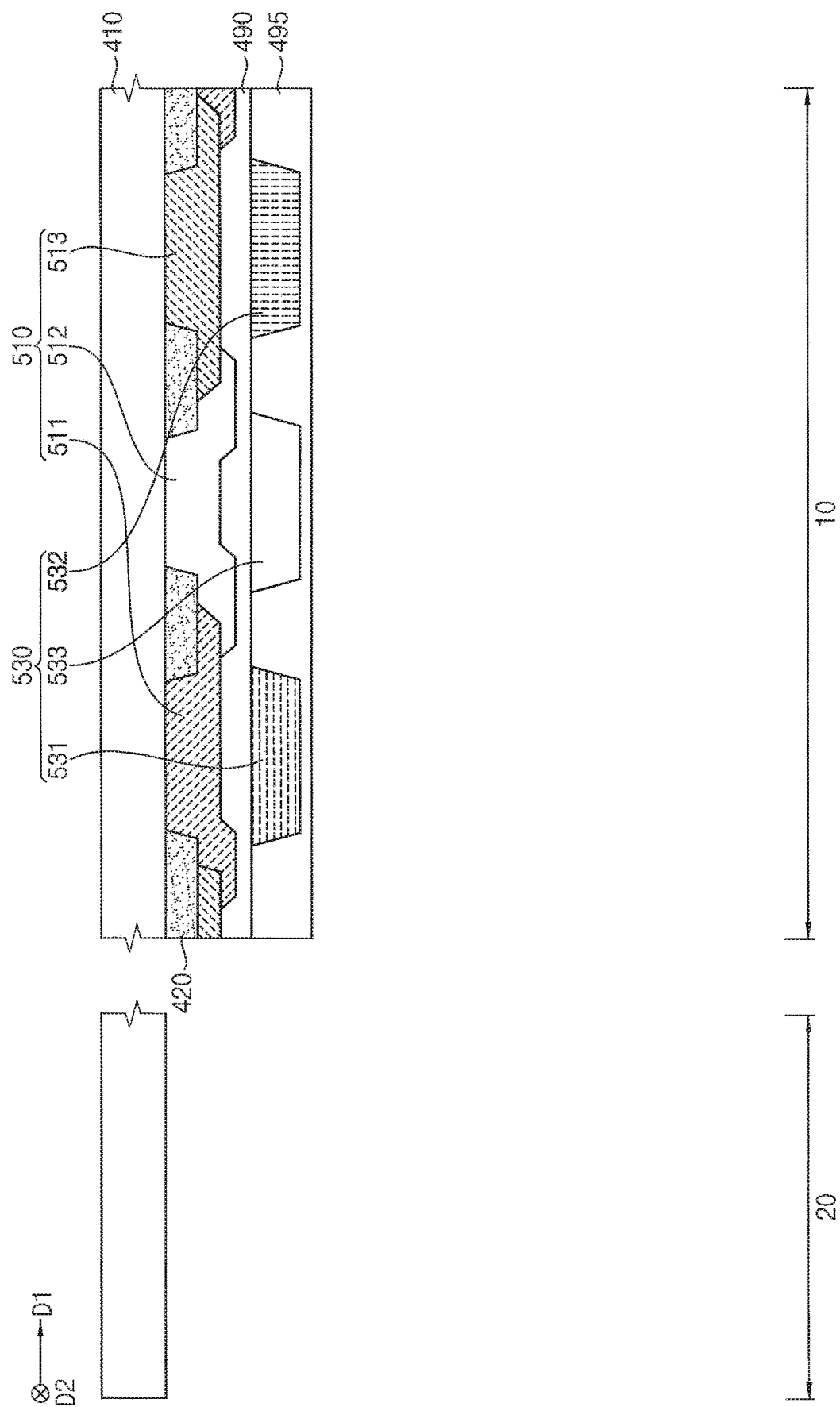
Figure 24:
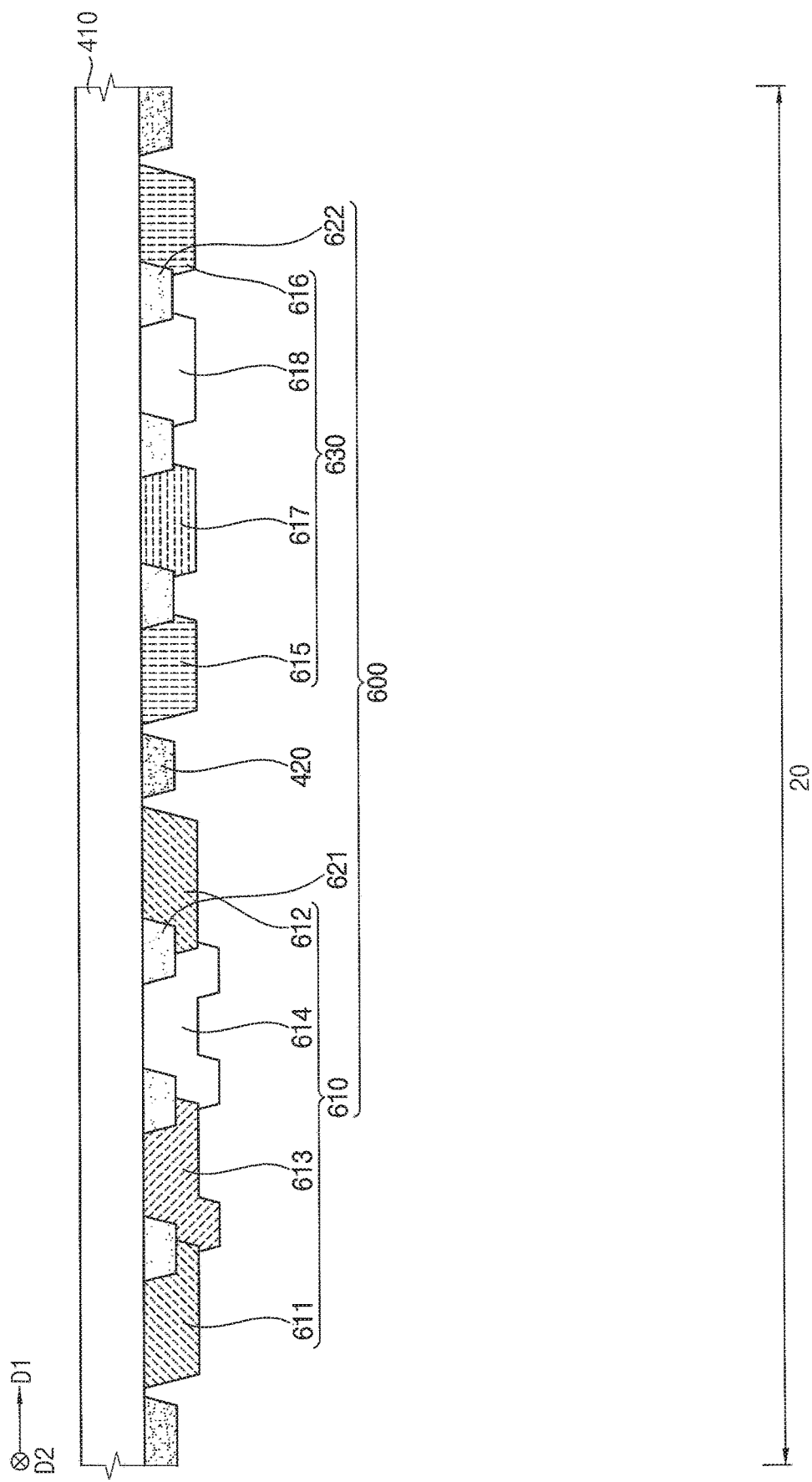

Referring to FIGS. 23 and 24, the first quantum dot pattern 531 having the second width along a first direction D1 may be formed on the bottom surface of the first protective layer 490 while overlapping the first color filter pattern 511 having the first width along a first direction D1. In other words, the first quantum dot pattern 531 may be spaced apart from the scattering pattern 533. The first quantum dot pattern 531 may convert blue light into green light. The first quantum dot pattern 531 may include a plurality of quantum dots. The quantum dots included in the first quantum dot pattern 531 may be formed using any one among silicon-based nanocrystal, II-VI group-based compound semiconductor nanocrystal, III-V group-based compound semiconductor nanocrystal, IV-VI group-based compound semiconductor nanocrystal, or a mixture thereof.

Accordingly, the optical filter layer 530 including the first quantum dot pattern 531, the second quantum dot pattern 532, and the scattering pattern 533 may be formed.

The second optical filter alignment pattern 617 emitting a green color light may be formed in the second opening 422 on the bottom surface of the upper substrate 410. For example, the second optical filter alignment pattern 617 having the second width along a first direction D1 may be formed to partially overlap the left second reference alignment pattern 622 located at the left side. In other words, one side of the second optical filter alignment pattern 617 may overlap the left second reference alignment patterns 622 located at the left side. The one side of the second optical filter alignment pattern 617 and the one side of the first optical filter alignment pattern 615 may be spaced apart from each other on the left first reference alignment pattern 621 located at the left side. In addition, the second optical filter alignment pattern 617 may be formed to partially overlap the center second reference alignment pattern 622 located at the center. In other words, the other side of the second optical filter alignment pattern 617 may overlap the center second reference alignment pattern 622 located at the center. The other side of the second optical filter alignment pattern 617 and the other side of the third optical filter alignment pattern 618 may be spaced apart from each other on the center second reference alignment pattern 622 located at the center. In exemplary embodiments, a shape of the second optical filter alignment pattern 617 may be the same as a shape of the first quantum dot pattern 531, and the second optical filter alignment pattern 617 and the first quantum dot pattern 531 may be simultaneously formed using the same material. In addition, the second width of the first quantum dot pattern 531 along a first direction D1 may be substantially the same as the second width W2 of the second optical filter alignment pattern 617 along a first direction D1.

Accordingly, the optical filter alignment patterns 630 including the first optical filter alignment pattern 615, the fourth optical filter alignment pattern 616, the second optical filter alignment pattern 617, and the third optical filter alignment pattern 618 may be formed, and the alignment structure 600 including the color filter alignment patterns 610, the first reference alignment patterns 621, the optical filter alignment patterns 630, and the second reference alignment patterns 622 may be formed.

The second protective layer 495 may be formed in the display area 10 on the bottom surface of the first protective layer 490 to cover the optical filter layer 530, and may not be formed in the peripheral area 20. For example, the second protective layer 495 have a thickness thick enough to sufficiently cover the optical filter layer 530 on the bottom surface of the first protective layer 490. The second protective layer 495 may be formed using an organic material.

Figure 25:
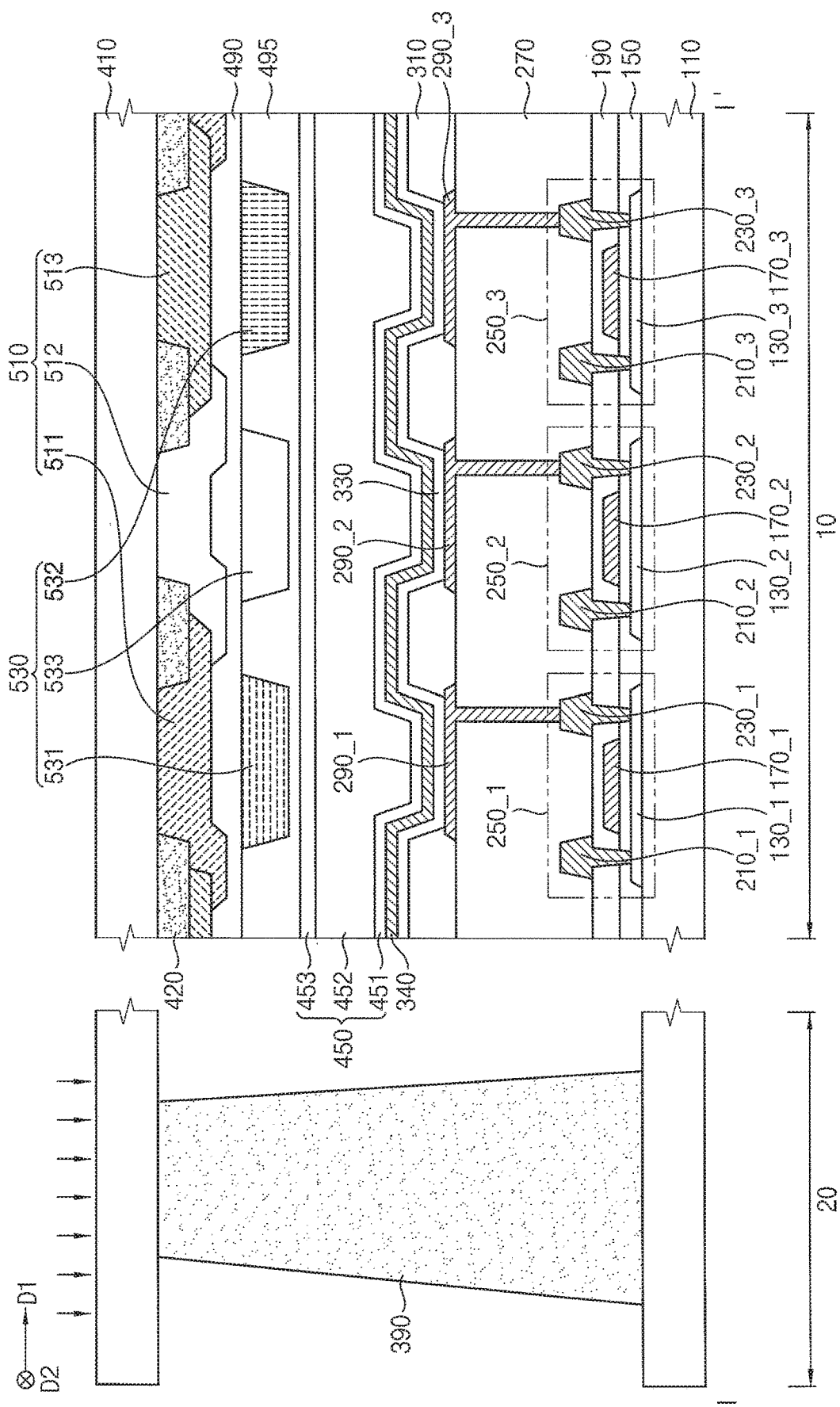

Referring to FIG. 25, the sealing pattern 390 may be formed in the peripheral area 20 on the lower substrate 110. The sealing pattern 390 may have a trapezoidal shape. The sealing pattern 390 may be formed in the peripheral area 20 on the upper substrate 410. In this case, the sealing pattern 390 may have an inverted trapezoidal shape. The sealing pattern 390 may be formed using a non-conductive material. For example, the sealing pattern 390 may include a frit or the like. In addition, the sealing pattern 390 may additionally include a photocurable material. For example, the sealing pattern 390 may include a mixture of an organic material and a photocurable material. The photocurable material included in the sealing pattern 390 may include epoxy acrylate-based resin, polyester acrylate-based resin, urethane acrylate-based resin, polybutadiene acrylate-based resin, silicone acrylate-based resin, alkyl acrylate-based resin, or the like.

After the sealing pattern 390 is formed, the bottom surface of the upper substrate 410 may come into contact with the sealing pattern 390. Then, ultraviolet rays (UV), laser light, visible light, or the like may be irradiated onto the sealing pattern 390. For example, the sealing pattern 390 may be irradiated with laser light. Upon the irradiation of laser light, the mixture may be changed from a solid state to a liquid state, and the mixture in the liquid state may be cured into the solid state after a predetermined time. The upper substrate 410 may be sealed and coupled to the lower substrate 110 according to the state change of the mixture.

Accordingly, the display device 100 shown in FIGS. 7 and 8 can be manufactured.

Figure 26:
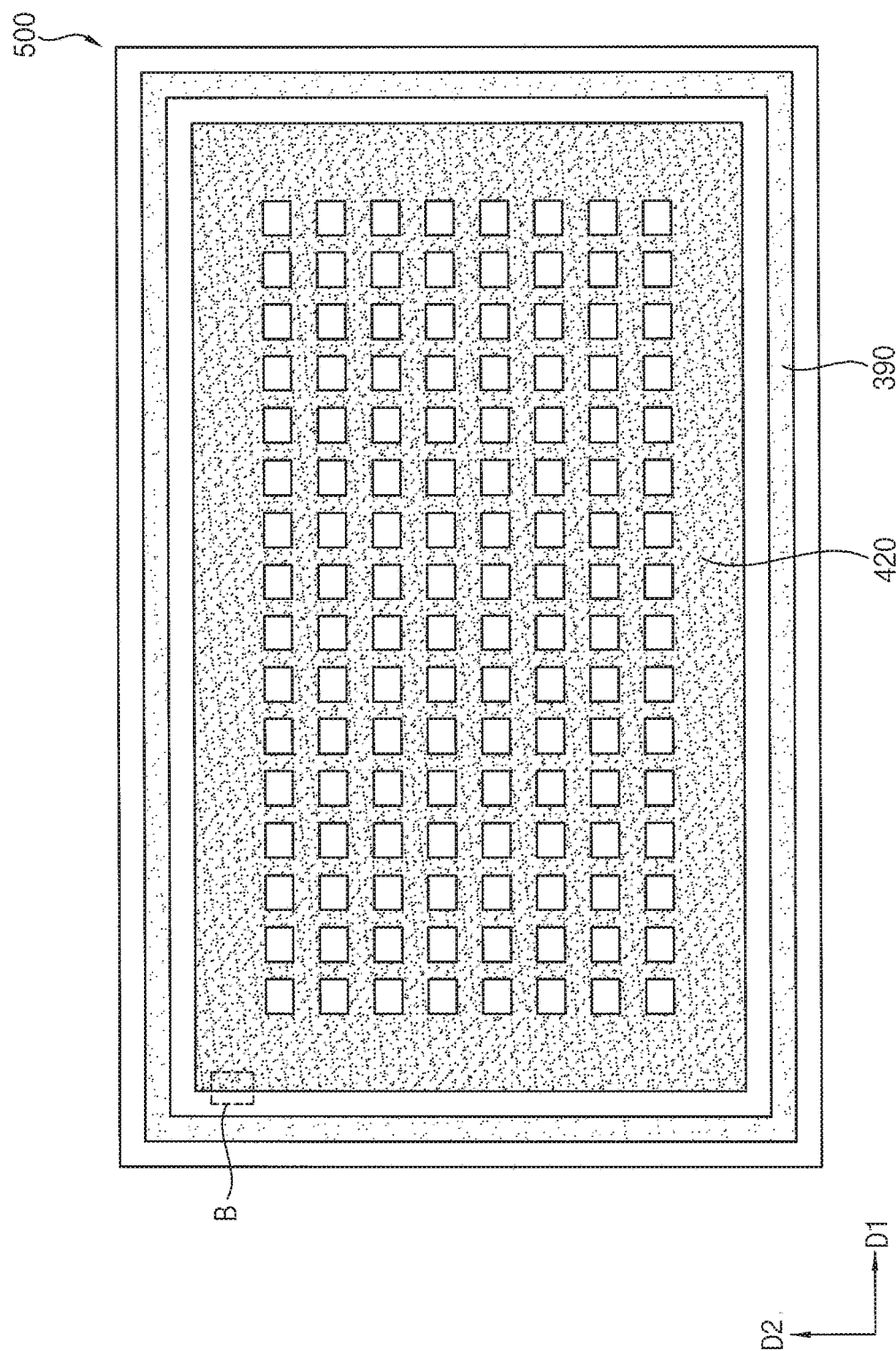
FIG. 26 is a plan view showing the display device according to exemplary embodiments of the present inventive concept.
Figure 27:
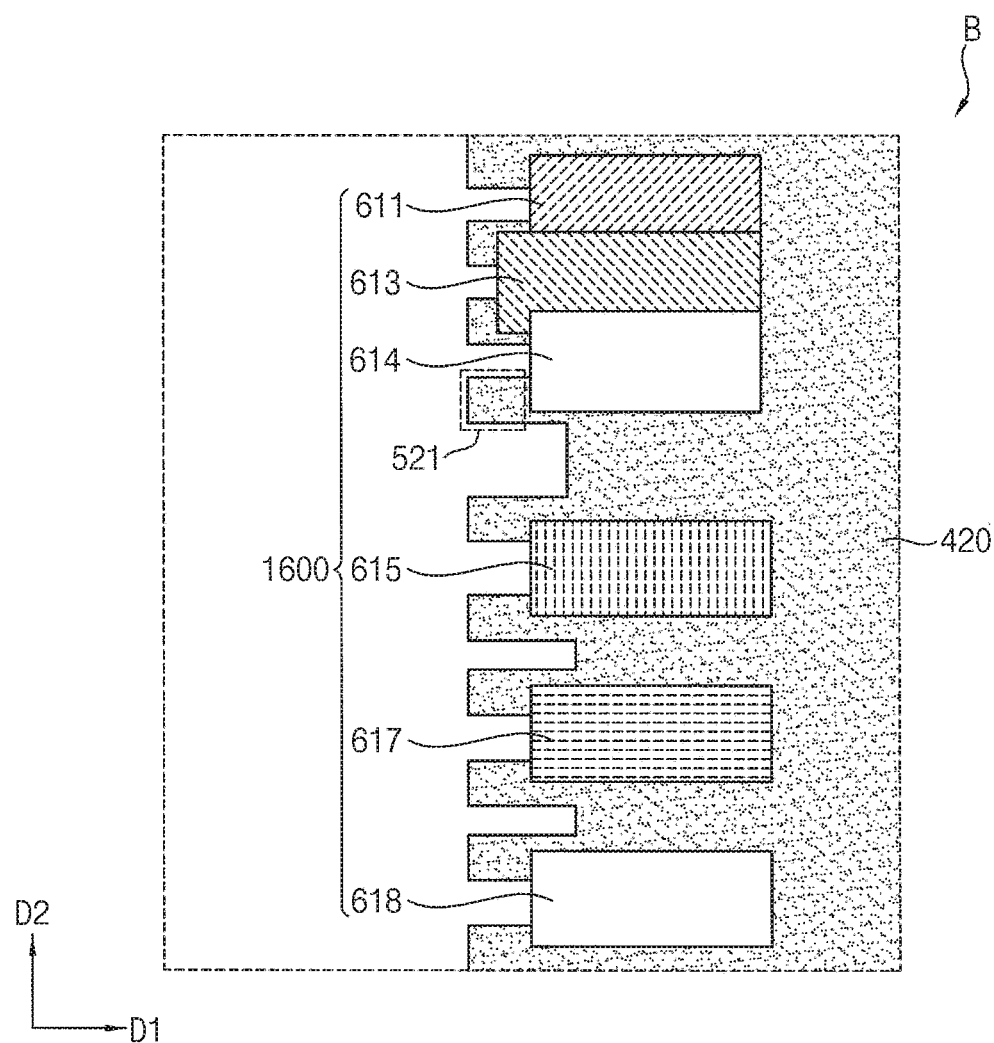
FIG. 27 is a partially enlarged plan view enlarging and showing the "B" area of FIG. 26.

FIG. 26 is a plan view showing the display device according to exemplary embodiments of the present inventive concept. FIG. 27 is a partially enlarged plan view enlarging and showing the "B" area of FIG. 26. The display device 500 illustrated in FIGS. 26 and 27 may have a configuration substantially the same as or similar to the display device 100 described with reference to FIGS. 1 to 8 except for the location of the alignment structure 1600. In FIGS. 26 and 27, duplicate descriptions for components substantially the same as or similar to the components described with reference to FIGS. 1 to 8 will be omitted.

Referring to FIGS. 1, 26 and 27, the display device 500 may include a lower substrate 110, a light shielding pattern 420, an alignment structure 1600, a sealing pattern 390, an upper substrate 410, and the like.

The display device 500 may include a display area 10 and a peripheral area 20 surrounding the display area 10. The display area 10 may include a plurality of sub-pixel areas 30. The sub-pixel areas 30 may be entirely arranged to have a matrix form in the display area 10.

The light shielding pattern 420 may be disposed in the display area 10 and a part of the peripheral area 20 on the bottom surface of the upper substrate. In exemplary embodiments, the light shielding pattern 420 may include protrusions 521 at an outer periphery of the light shielding pattern 420, and the alignment structure 1600 may be disposed to overlap the protrusions 521.

Figure 28:
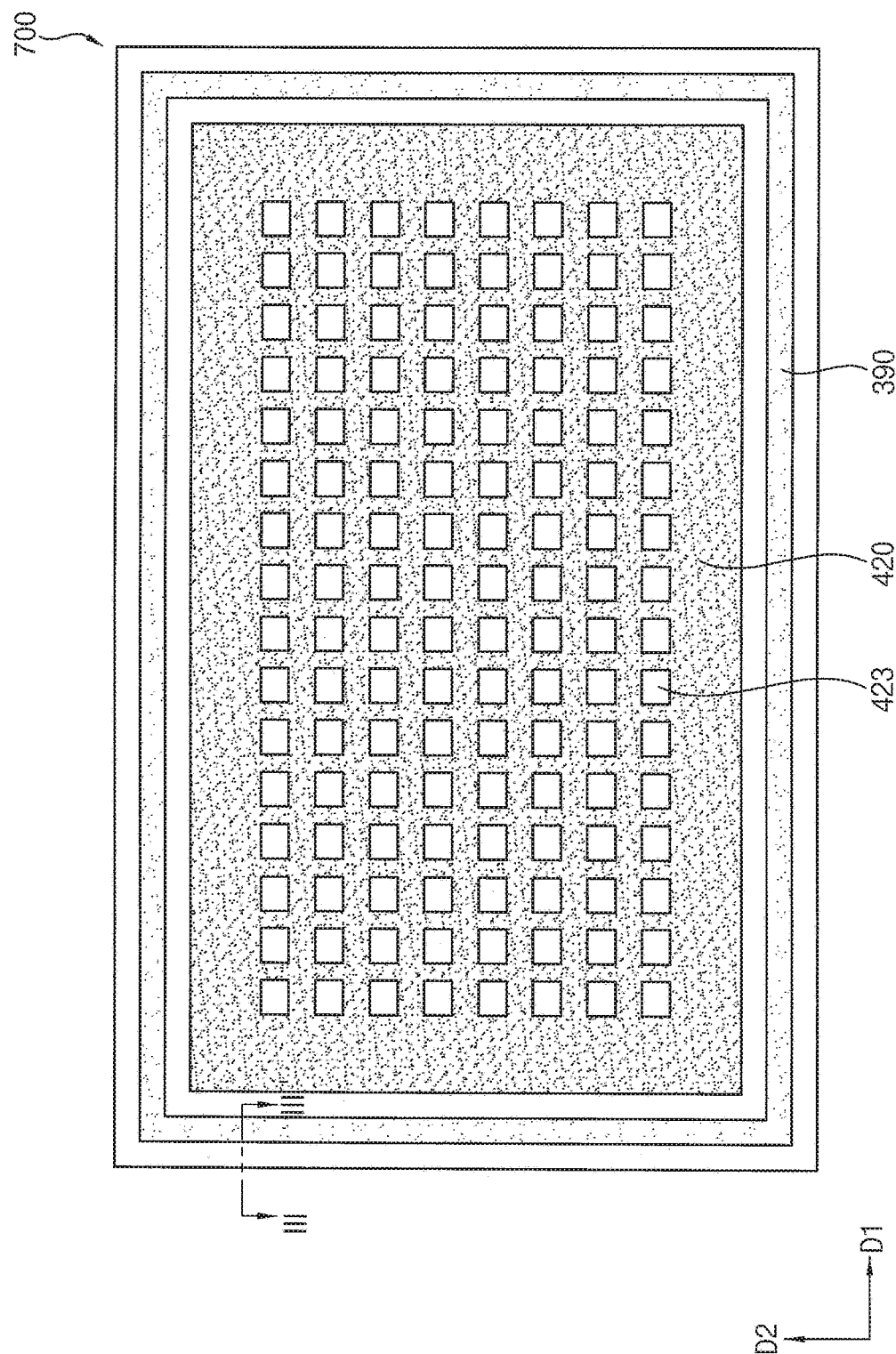
FIG. 28 is a plan view showing a display device according to exemplary embodiments of the present inventive concept.
Figure 29:
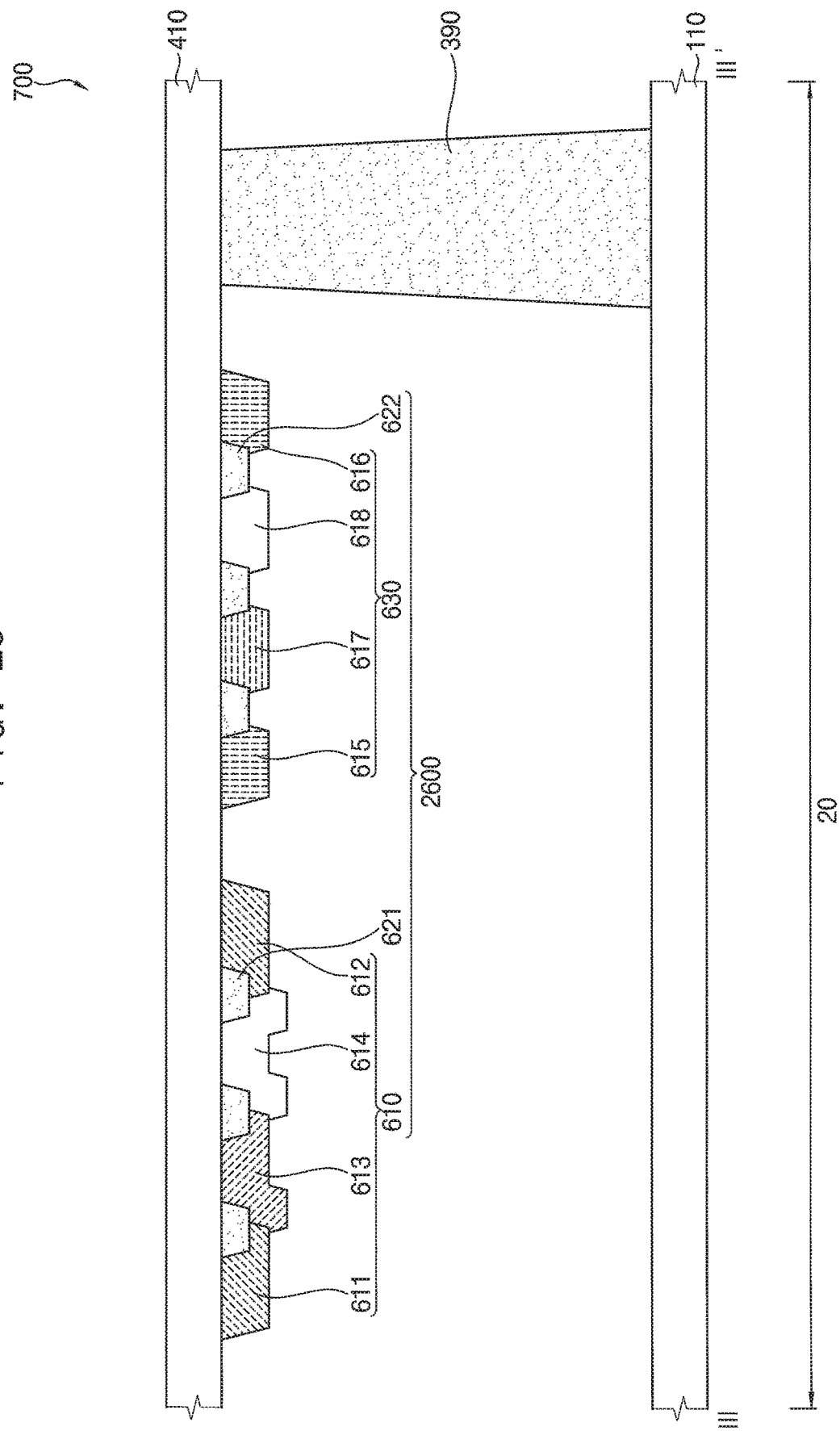
FIG. 29 is a sectional view taken along line III-III' of FIG. 28.

FIG. 28 is a plan view showing a display device according to exemplary embodiments of the present inventive concept. FIG. 29 is a sectional view taken along line III-III' of FIG. 28. The display device 700 illustrated in FIGS. 28 and 29 may have a configuration substantially the same as or similar to the display device 100 described with reference to FIGS. 1 to 8 except for the location of the alignment structure 2600. In FIGS. 28 and 29, duplicate descriptions for components substantially the same as or similar to the components described with reference to FIGS. 1 to 8 will be omitted.

Referring to FIGS. 28 and 29, the display device 700 may include a lower substrate 110, a first semiconductor element 250_1, a second semiconductor element 250_2, a third semiconductor element 250_3, a gate insulating layer 150, an interlayer insulating layer 190, a planarization layer 270, a first lower electrode 290_1, a second lower electrode 290_2, a third lower electrode 290_3, a light emitting layer 330, an upper electrode 340, a thin film encapsulation structure 450, a second protective layer 495, an optical filter layer 530, a first protective layer 490, a color filter layer 510, a light shielding pattern 420, an alignment structure 2600, a sealing pattern 390, an upper substrate 410, and the like. The first lower electrode 290_1, the light emitting layer 330, and the upper electrode 340 are defined as a first sub-pixel structure, the second lower electrode 290_2, the light emitting layer 330, and the upper electrode 340 are defined as a second sub-pixel structure, and the third lower electrode 290_3, the light emitting layer 330, and the upper electrode 340 are defined as a third sub-pixel structure. The light shielding pattern 420 may have the third openings 423, and the first to third sub-pixel structures may overlap the third openings 423.

The alignment structure 2600 may include color filter alignment patterns 610, first reference alignment patterns 621, optical filter alignment patterns 630, and second reference alignment patterns 622, in which the color filter alignment patterns 610 may include a first color filter alignment pattern 611, a fourth color filter alignment pattern 612, a second color filter alignment pattern 613, and a third color filter alignment pattern 614, and the optical filter alignment patterns 630 may include a first optical filter alignment pattern 615, a fourth optical filter alignment pattern 616, a second optical filter alignment pattern 617, and a third optical filter alignment pattern 618.

In exemplary embodiments, the alignment structure 2600 may be disposed at the outermost position of the bottom surface of the upper substrate 410. In other words, the alignment structure 2600 may be disposed on opposite side of the display area 10 with respect to the sealing pattern 390 to be spaced apart from the sealing pattern 390.

The present inventive concept may be applied to various display devices including a display device. For example, the present inventive concept may be applied to vehicle-display device, a ship-display device, an aircraft-display device, portable communication devices, display devices for display or for information transfer, a medical-display device, etc The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
    a lower substrate having a display area and a peripheral area surrounding the display area;
    a sub-pixel structure in the display area on the lower substrate;
    an optical filter layer on the sub-pixel structure;
    a color filter layer on the optical filter layer;
    an upper substrate on the color filter layer; and
    an alignment structure in the peripheral area on a bottom surface of the upper substrate, the alignment structure containing a material equal to a material forming the optical filter layer and the color filter layer.

2. The display device of claim 1, wherein the alignment structure has at least two layers partially overlapping each other.

3. The display device of claim 1, further comprising a light shielding pattern disposed between the upper substrate and the optical filter layer in the display area and the peripheral area on the bottom surface of the upper substrate.

4. The display device of claim 3, wherein the light shielding pattern has a first opening in the peripheral area, the first opening exposing the alignment structure.

5. The display device of claim 4, wherein the color filter layer includes first to third color filter patterns, and the alignment structure includes first to third color filter alignment patterns disposed in the first opening, and
    wherein each of the first to third color filter patterns has a width equal to a width of each of the first to third color filter alignment patterns.

6. The display device of claim 5, wherein adjacent two color filter alignment patterns among the first to third color filter alignment patterns partially overlap each other.

7. The display device of claim 5, wherein the light shielding pattern further includes a second opening in the peripheral area,
    wherein the optical filter layer includes first to third optical filter patterns, the alignment structure further includes first to third optical filter alignment patterns disposed in the second opening, and
    wherein each of the first to third optical filter patterns has a width equal to a width of each of the first to third optical filter alignment patterns.

8. The display device of claim 7, wherein the first to third optical filter alignment patterns are spaced apart from each other.

9. The display device of claim 7, wherein the alignment structure further includes reference alignment patterns disposed between the first to third color filter alignment patterns and the upper substrate and between the first to third optical filter alignment patterns and the upper substrate, and the reference alignment patterns are disposed on a same layer as the light shielding pattern, and
wherein each of the first to third color filter alignment patterns and the first to third optical filter alignment patterns partially overlaps the reference alignment patterns.

10. The display device of claim 4, wherein the alignment structure includes:
a first color filter alignment pattern disposed in the first opening on the bottom surface of the upper substrate;
a second color filter alignment pattern disposed in the first opening and partially overlapping one side of the first color filter alignment pattern on the bottom surface of the upper substrate;
a third color filter alignment pattern disposed in the first opening and partially overlapping one side of the second color filter alignment pattern on the bottom surface of the upper substrate; and
first reference alignment patterns disposed in the first opening and spaced apart from each other between the first, second and third color filter alignment patterns and the upper substrate.

11. The display device of claim 10, wherein the light shielding pattern further includes a second opening in the peripheral area, and
wherein the alignment structure further includes:
a first optical filter pattern disposed in the second opening on the bottom surface of the upper substrate;
a second optical filter pattern disposed in the second opening and spaced apart from the first optical filter alignment pattern on the bottom surface of the upper substrate in a first direction;
a third optical filter pattern disposed in the second opening and spaced apart from the second optical filter alignment pattern on the bottom surface of the upper substrate in the first direction; and
second reference alignment patterns disposed in the second opening and spaced apart from each other between the first, second and third optical filter alignment patterns and the upper substrate.

12. The display device of claim 11, wherein the alignment structure further includes:
a fourth color filter alignment pattern disposed in the first opening and partially overlapping one side of the third color filter alignment pattern on the bottom surface of the upper substrate; and
a fourth optical filter alignment pattern disposed in the first opening and spaced apart from the third optical filter alignment pattern on the bottom surface of the upper substrate in the first direction, and wherein:
the overlapping portion between the first and second color filter alignment patterns is defined as a first overlapping portion,
the overlapping portion between the second and third color filter alignment patterns is defined as a second overlapping portion,
the overlapping portion between the third and fourth color filter alignment patterns is defined as a third overlapping portion,
the spaced portion between the first and second optical filter alignment patterns is defined as a first spaced portion,
the spaced portion between the second and third optical filter alignment patterns is defined as a second spaced portion, and
the spaced portion between the third and fourth optical filter alignment patterns is defined as a third spaced portion.

13. The display device of claim 4, wherein the light shielding pattern further includes a third opening in the display area, and
wherein the color filter layer is disposed in the third opening, and the third opening overlaps the sub-pixel structure and the optical filter layer.

14. The display device of claim 13, further comprising a sealing pattern spaced apart from the sub-pixel structure, the optical filter layer, and the color filter layer in the peripheral area between the lower substrate and the upper substrate, the sealing pattern surrounding the display area.

15. The display device of claim 3, wherein the light shielding pattern includes a plurality of protrusions at an outer periphery of the light shielding pattern, and the alignment structure overlaps with the protrusions of the light shielding pattern.

16. The display device of claim 1, further comprising:
a light shielding pattern disposed between the upper substrate and the optical filter layer in the display area; and
a sealing pattern spaced apart from the light shielding pattern in the peripheral area between the lower substrate and the upper substrate, the sealing pattern surrounding the light shielding pattern, wherein
the alignment structure is disposed on opposite side of the display area with respect to the sealing pattern and spaced apart from the sealing pattern.

17. The display device of claim 1, wherein the sub-pixel structure includes first, second, and third sub-pixel structures, and each of the first to third sub-pixel structures includes:
a lower electrode disposed on the lower substrate;
a light emitting layer disposed on the lower electrode; and
an upper electrode disposed on the light emitting layer, and wherein
the light emitting layer emits blue light, and is integrally formed in the display area on the lower substrate.

18. The display device of claim 17, wherein the optical filter layer includes
a first quantum dot pattern disposed on the first sub-pixel structure to convert blue light into green light;
a scattering pattern disposed on the second sub-pixel structure to transmit the blue light; and
a second quantum dot pattern disposed on the third sub-pixel structure to convert the blue light into red light.

19. The display device of claim 18, wherein the color filter layer includes:
a first color filter pattern disposed on the first quantum dot pattern to transmit green light;
a second color filter pattern disposed on the scattering pattern to transmit blue light; and
a third color filter pattern disposed on the second quantum dot pattern to transmit red light.

20. The display device of claim 1, further comprising a thin film encapsulation structure disposed in the display area between the sub-pixel structure and the optical filter layer.

* * * * *